(12) United States Patent
Choi et al.

(10) Patent No.: US 12,073,794 B2
(45) Date of Patent: Aug. 27, 2024

(54) GATE DRIVING CIRCUIT AND DISPLAY DEVICE INCLUDING GATE DRIVING CIRCUIT

(71) Applicant: LG Display Co., Ltd., Seoul (KR)

(72) Inventors: Jaeyi Choi, Seoul (KR); Seongho Yun, Gyeonggi-do (KR); SooHong Choi, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/054,872

(22) Filed: Nov. 11, 2022

(65) Prior Publication Data

US 2023/0215378 A1 Jul. 6, 2023

(30) Foreign Application Priority Data

Dec. 31, 2021 (KR) .......................... 10-2021-0194274

(51) Int. Cl.
*G09G 3/3266* (2016.01)
*G09G 3/3291* (2016.01)

(52) U.S. Cl.
CPC .......... *G09G 3/3266* (2013.01); *G09G 3/3291* (2013.01); *G09G 2310/0278* (2013.01); *G09G 2310/08* (2013.01)

(58) Field of Classification Search
CPC .. G09G 3/3266; G09G 3/3611; G09G 3/3674; G09G 3/3677; G09G 2320/043
See application file for complete search history.

(56) References Cited

U.S. PATENT DOCUMENTS

| | | | |
|---|---|---|---|
| 8,228,281 B2* | 7/2012 | Woo | G09G 3/3677 345/100 |
| 8,730,144 B2 | 5/2014 | Lee et al. | |
| 2010/0182227 A1* | 7/2010 | Tsou | G11C 19/28 345/100 |
| 2014/0085285 A1* | 3/2014 | Kim | G11C 19/28 377/67 |
| 2017/0221411 A1* | 8/2017 | Chang | G11C 19/287 |
| 2018/0096645 A1* | 4/2018 | Lee | G09G 3/20 |
| 2018/0337682 A1* | 11/2018 | Takasugi | H03K 21/18 |

FOREIGN PATENT DOCUMENTS

KR 20110140009 A 12/2011

* cited by examiner

*Primary Examiner* — Sepehr Azari
(74) *Attorney, Agent, or Firm* — Seed IP Law Group LLP

(57) ABSTRACT

The present disclosure relates to a gate driving circuit and a display device including the gate driving circuit, and more particularly, to a gate driving circuit having a reduced size and a display device including the gate driving circuit. The gate driving circuit comprises a plurality of dummy stage circuits and stage circuits, which supply gate signals to each gate line and comprise a Q node, a QH node, and a QB node. A gate signal output circuit included in each of the stage circuits can output first to j-th gate signals based on first to j-th scan clock signals or a first low voltage according to the voltage level of the Q node or the voltage level of the QB node.

15 Claims, 14 Drawing Sheets

GATE DRIVING CIRCUIT AND DISPLAY DEVICE INCLUDING GATE DRIVING CIRCUIT

CROSS-REFERENCE TO RELATED APPLICATION

This application claims the benefit of and priority to Republic of Korea Patent Application No. 10-2021-0194274, filed Dec. 31, 2021 in the Korean Intellectual Property Office, which is incorporated herein by reference in its entirety.

BACKGROUND

Technical Field

The present disclosure relates to gate driving circuits and electronic devices including the gate driving circuit, and more particularly, to a gate driving circuit and a display device including the gate driving circuit.

Description of the Related Art

Recently, display devices employing a flat display panel such as a liquid crystal display device, an organic light emitting diode display device, a light emitting diode display device, and an electrophoretic display device has been widely used.

Display devices can include light emitting elements and pixels having pixel circuits for driving the light emitting elements. For example, a pixel circuit includes a driving transistor for controlling a driving current supplied to a light emitting element, and at least one switching transistor for controlling (or programming) a gate-source voltage of the driving transistor according to a gate signal. The switching transistor of the pixel circuit may be switched by a gate signal supplied by a gate driving circuit disposed on a substrate of a display panel.

The display device includes a display area in which an image is displayed, and a non-display area in which an image is not displayed. As the size of the non-display area decreases, the size of an edge or bezel area of the display device decreases, and the size of the display area increases.

BRIEF SUMMARY

In the display device, since the gate driving circuit is disposed in the non-display area, the size of the display area can increase as the size of the gate driving circuit decreases.

The gate driving circuit can include a plurality of stage circuits. Each of the stage circuits can include a plurality of transistors for generating gate signals. As the number of transistors included in each stage circuit increases, the size of the stage circuit and the size of the gate driving circuit can increase. Thus, in order to reduce the size of the gate driving circuit and increase the size of the display area, it is desirable to reduce the number of transistors included in each stage circuit.

As the number of times that transistors included in each stage circuit are driven increases, the characteristics of the transistors, for example, a value of threshold voltage can change. In a situation where a voltage at a control node drops as a value of the threshold voltage of a transistor changes, the transistor cannot be completely turned off. Due to this, a leakage current may be generated in each stage circuit during the process of driving the gate driving circuit. If a gate signal is not normally output due to such a leakage current, the image quality of the display device may become poor.

In addition, as the number of times that transistors included in each stage circuit are driven increases, the transistors may be rapidly degraded, and the lifespan of the display device may be shortened.

The present disclosure provides embodiments to address one or more of these issues.

According to embodiments of the present disclosure, a gate driving circuit having a reduced size and a display device having an increased display area size are provided by reducing the number of transistors included in stage circuits and the number of lines connected to the transistors.

According to embodiments of the present disclosure, a gate driving circuit and a display device that have improved durability and reliability are provided by reducing voltage stress of transistors included in stage circuits and thereby enabling the lifespan of the transistors to extend.

According to embodiments of the present disclosure, display artifacts such as a horizontal line and the like caused in variable refresh rate (VRR) driving can be reduced or eliminated by changing a connection structure of a carry signal line of stage circuits.

Problems or issues to be solved herein are not limited to the above description, and other problems or issues to be solved will become apparent to those skilled in the art from the following description.

According to one aspect of the present disclosure, a gate driving circuit is provided that includes a plurality of stage circuits that are capable of supplying gate signals to each of a plurality of gate lines, and include an M node, a Q node, a QH node, and a QB node, and a plurality of dummy stage circuits configured in preceding stages of a first stage circuit of the plurality of stage circuits in order for gate signals to be stably output.

In one embodiment, each of the plurality of stage circuits can include a line selector, a Q node controller, a Q node and QH node stabilizing circuit, an inverter, a QB node stabilizing circuit, a carry signal output circuit, and a gate signal output circuit.

The line selector can charge the M node based on a preceding stage carry signal in response to the input of a line sensing preparation signal, and charge the Q node to a first high voltage level in response to the input of a reset signal or discharge the Q node to a third low voltage level in response to the input of a panel-on signal.

The Q node controller can charge the Q node to the first high voltage level in response to the input of a start signal or the preceding stage carry signal, and discharge the Q node to the third low voltage level in response to the input of a following stage carry signal.

The Q node and QH node stabilizing circuit can discharge the Q node and the QH node to the third low voltage level when the QB node is charged to a second high voltage level.

The inverter can change a voltage level of the QB node according to a voltage level of the Q node.

The QB node stabilizing circuit can discharge the QB node to the third low voltage level in response to the input of the preceding stage carry signal, the input of the reset signal, and a charged voltage of the M node.

The carry signal output circuit can output a carry signal C(k) based on a voltage level of a carry clock signal CRCLK(k) according to the voltage level of the Q node or the third low voltage (GVSS3) level according to the voltage level of the QB node.

The gate signal output circuit can output first to j-th gate signals based on first to j-th scan clock signals or a first low voltage according to the voltage level of the Q node or the voltage level of the QB node.

In one embodiment, the dummy stage circuits can be set nearly simultaneously in response to a start signal, and output a carry signal whose phase is sequentially delayed in sync with a gate shift clock.

Each of the dummy stage circuits can include a Q node controller, a Q node and QH node stabilizing circuit, an inverter, and a carry signal output circuit, and further include an FB TFT circuit.

The FB TFT circuit is designed to have the same circuit structure as a T3 TFT in which the same gate-source voltage Vgs as the T3 TFT is applied. In this case, when PBTS (positive bias temperature stress, a threshold voltage Vth of the T3 TFT is plus-shifted) degradation for the T3 TFT proceeds, a threshold voltage Vth of the FB TFT circuit becomes plus-shifted, and a corresponding flowing current becomes reduced. A PGVDD voltage generation block (not shown) can sense such a reduced current of the FB TFT circuit and increase the corresponding PGVDD voltage by the threshold voltage Vth.

In another aspect of the present disclosure, a display device is provided that includes a display panel including sub-pixels, each positioned adjacent to an overlap of a gate line and a data line, a gate driving circuit for supplying scan signals to each of the gate lines, a data driving circuit for supplying data voltages to each of the data lines, and a timing controller for controlling the driving of the gate driving circuit and the data driving circuit.

In one embodiment, the gate driving circuit can include a plurality of stage circuits that are capable of supplying gate signals to each of a plurality of gate lines, and include an M node, a Q node, a QH node, and a QB node, and a plurality of dummy stage circuits configured in preceding stages of a first stage circuit of the plurality of stage circuits in order for gate signals to be stably output.

In one embodiment, each of the plurality of stage circuits can include a line selector, a Q node controller, a Q node and QH node stabilizing circuit, an inverter, a QB node stabilizing circuit, a carry signal output circuit, and a gate signal output circuit.

The line selector can charge the M node based on a preceding stage carry signal in response to the input of a line sensing preparation signal, and charge the Q node to a first high voltage level in response to the input of a reset signal or discharge the Q node to a third low voltage level in response to the input of a panel-on signal.

The Q node controller can charge the Q node to the first high voltage level in response to the input of a start signal or the preceding stage carry signal, and discharge the Q node to the third low voltage level in response to the input of a following stage carry signal.

The Q node and QH node stabilizing circuit can discharge the Q node and the QH node to the third low voltage level when the QB node is charged to a second high voltage level.

The inverter can change a voltage level of the QB node according to a voltage level of the Q node.

The QB node stabilizing circuit can discharge the QB node to the third low voltage level in response to the input of the preceding stage carry signal, the input of the reset signal, and a charged voltage of the M node.

The carry signal output circuit can output a carry signal C(k) based on a voltage level of a carry clock signal CRCLK(k) according to the voltage level of the Q node or the third low voltage (GVSS3) level according to the voltage level of the QB node.

The gate signal output circuit can output first to j-th gate signals based on first to j-th scan clock signals or a first low voltage according to the voltage level of the Q node or the voltage level of the QB node.

In one embodiment, the dummy stage circuits can be set nearly simultaneously in response to a start signal, and output a carry signal whose phase is sequentially delayed in sync with a gate shift clock.

Each of the dummy stage circuits can include a Q node controller, a Q node and QH node stabilizing circuit, an inverter, and a carry signal output circuit, and further include an FB TFT circuit.

The FB TFT circuit is designed to have the same circuit structure as a T3 TFT in which the same gate-source voltage Vgs as the T3 TFT is applied. In this case, when PBTS (positive bias temperature stress, a threshold voltage Vth of the T3 TFT is plus-shifted) degradation for the T3 TFT proceeds, a threshold voltage Vth of the FB TFT circuit becomes plus-shifted, and a flowing current becomes reduced. A PGVDD voltage generation block (not shown) can sense such a reduced current of the FB TFT circuit and increase the corresponding PGVDD voltage by the threshold voltage Vth.

According to embodiments of the present disclosure, the number of transistors included in stage circuits of a gate driving circuit and the number of lines connected to the transistors can be reduced, and the gate driving circuit can be stably driven. If the number of transistors included in each stage circuit decreases, the size of the gate driving circuit can be reduced, and the reduction in the size of the stage circuit can enable the size of the display area of a display device to increase. Further, the reduction in the number of transistors included in the stage circuit can provide advantages of enabling the stage circuit to be configured and designed more simply.

Further, according to embodiments of the present disclosure, a voltage level input to transistors included in stage circuits can be adjusted depending on a driving time of the display device. Thereby, the voltage stress of the transistors can be reduced, and the lifespan of the transistors can be extended. In turn, durability of the gate driving circuit and the display device can be improved, and driving reliability of the gate driving circuit and the display device can be improved.

Further, according to embodiments of the present disclosure, the image display quality of the display device can be improved by solving a horizontal line artifact caused during VRR driving through the changing of a connection structure of a carry signal line of stage circuits.

BRIEF DESCRIPTION OF THE SEVERAL
VIEWS OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

Figure 13:
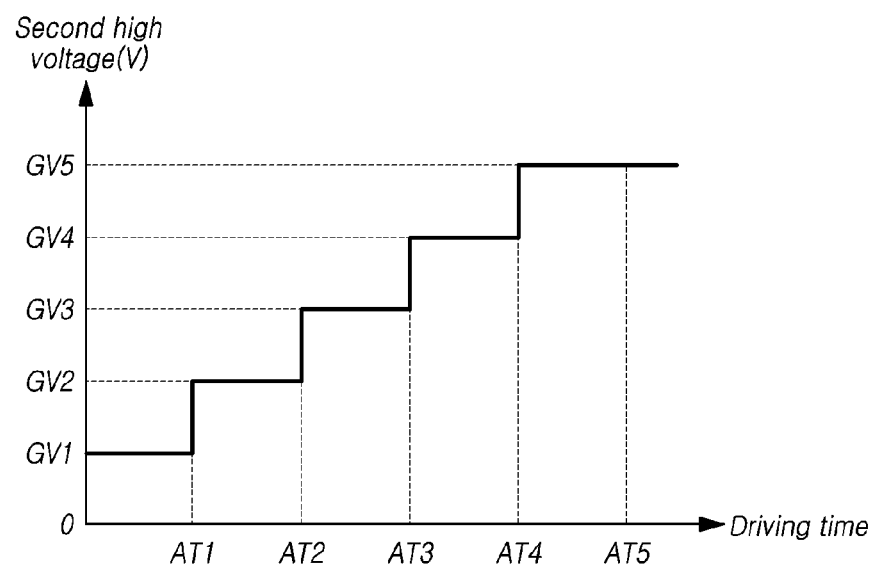
Figure 14:
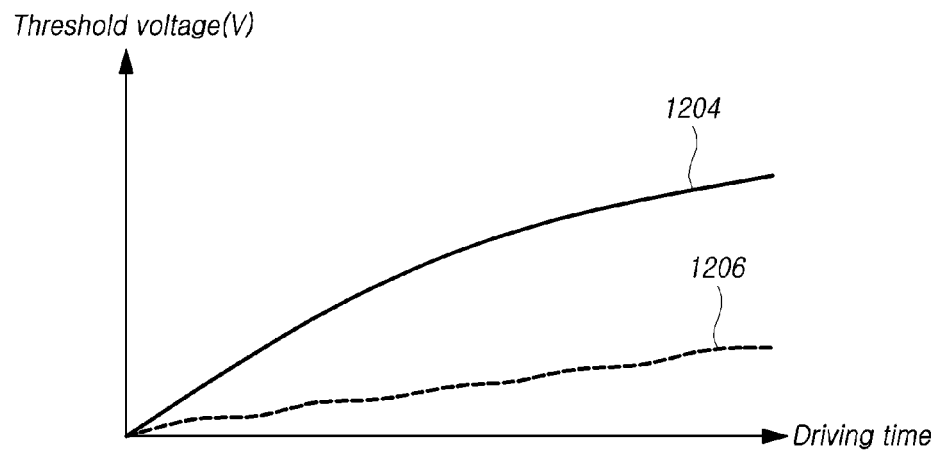

FIG. 13 is a graph representing a change in the magnitude of a second high voltage according to a driving time of the gate driving circuit in the display device according to aspects of the present disclosure; and FIG. 14 is a graph representing a change in the threshold voltage magnitude of a transistor according to a driving time of the gate driving circuit in the display device according to aspects of the present disclosure.

DETAILED DESCRIPTION

The advantages and features of the present disclosure and methods of achieving the same will be apparent by referring to embodiments of the present disclosure as described below in detail in conjunction with the accompanying drawings. Embodiments set forth below are described in the context of particular embodiments, and provided only to completely disclose the present disclosure and inform those skilled in the art to which embodiments according to the present disclosure pertains. However, it will be understood that these embodiments may be implemented in various different forms, and in turn, many variations, modifications, additions, and improvements are possible. Therefore, the scope of the present disclosure is not limited to embodiments described below.

In addition, the shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description of the present disclosure, detailed description of well-known functions and configurations incorporated herein may be omitted when it is determined that the description may make the subject matter in some embodiments of the present disclosure rather unclear. The terms such as "including," "having," "containing," "comprising of," and "consist of" used herein are generally intended to allow other components to be added unless the terms are used with the term "only." Singular forms used herein are intended to include plural forms unless the context clearly indicates otherwise.

In interpreting any elements or features in embodiments of the present disclosure, it should be interpreted that any dimensions and relative sizes of layers, areas and regions include a tolerance or error range even when a specific description is not given.

Spatially relative terms, such as, "on," "over," "above," "below," "under," "beneath," "lower," "upper," "near," "close," "adjacent," and the like, may be used herein to describe one element or feature's relationship to another element(s) or feature(s) as illustrated in the figures, and it should be interpreted that one or more elements may be further "interposed" between the elements unless the terms such as "directly," "only" are used.

Time relative terms, such as "after," "subsequent to," "next to," "before," or the like, used herein to describe a temporal relationship between events, operations, or the like are generally intended to include events, situations, cases, operations, or the like that do not occur consecutively unless the terms, such as "directly," "immediately," or the like, are used.

When embodiments related to signal flows are discussed, for example, an embodiment where a signal is transmitted from node A to node B may include the transmission of the signal from node A to node B by way of another node unless 'direct' or 'directly' is used.

When the terms, such as "first," "second," or the like, are used herein to describe various elements or components, it should be understood that these elements or components are not limited thereto. These terms are merely used herein for distinguishing an element from other elements. Therefore, a first element mentioned below may be a second element in a technical concept of the present disclosure.

The elements or features of various embodiments of the present disclosure can be partially or entirely bonded to or combined with each other and can be interlocked and operated in technically various ways as can be fully understood by a person having ordinary skill in the art, and the various embodiments can be carried out independently of or in association with each other.

According to embodiments of the present disclosure, a sub-pixel circuit and a gate driving circuit disposed on a substrate of a display panel may be implemented using transistors having an n-type MOSFET structure. However, embodiments of the present disclosure are not limited thereto; for example, transistors employed in the sub-pixel circuit and the gate driving circuit may be p-type MOSFETs. A transistor may include a gate, a source, and a drain. In the transistor, carries can flow from the source to the drain. In the case of an n-type transistor, a source voltage is lower than a drain voltage so that electrons can move from the source to the drain because carriers are electrons. In the n-type transistor, since electrons move from the source to the drain, current can flow from the drain to the source. In the case of an p-type transistor, a source voltage is higher than a drain voltage so that holes can move from the source to the drain because carriers are holes. In the p-type transistor, since holes move from the source to the drain, current can flow from the source to the drain. In the transistor having the MOSFET structure, the source and drain are not fixed, and thus, are interchangeable according to an applied voltage. Accordingly, it should be noted that herein, any one of the source and the drain is referred to as a first source/drain electrode, and the other one of the source and the drain is referred to as a second source/drain electrode.

Hereinafter, examples of a gate driving circuit and a display device including the gate driving circuit according to aspects of the present disclosure will be described in detail with reference to the accompanying drawings. Even when illustrated in different drawings, the same elements, substantially the same elements, or nearly the same elements may have the same reference numerals. Since elements in the accompanying drawings are illustrated for convenience of description and may have different scales in gate driving circuits, display device, and electronic devices, thus, the drawings are to be regarded as illustrative in nature and not restrictive.

Figure 1:
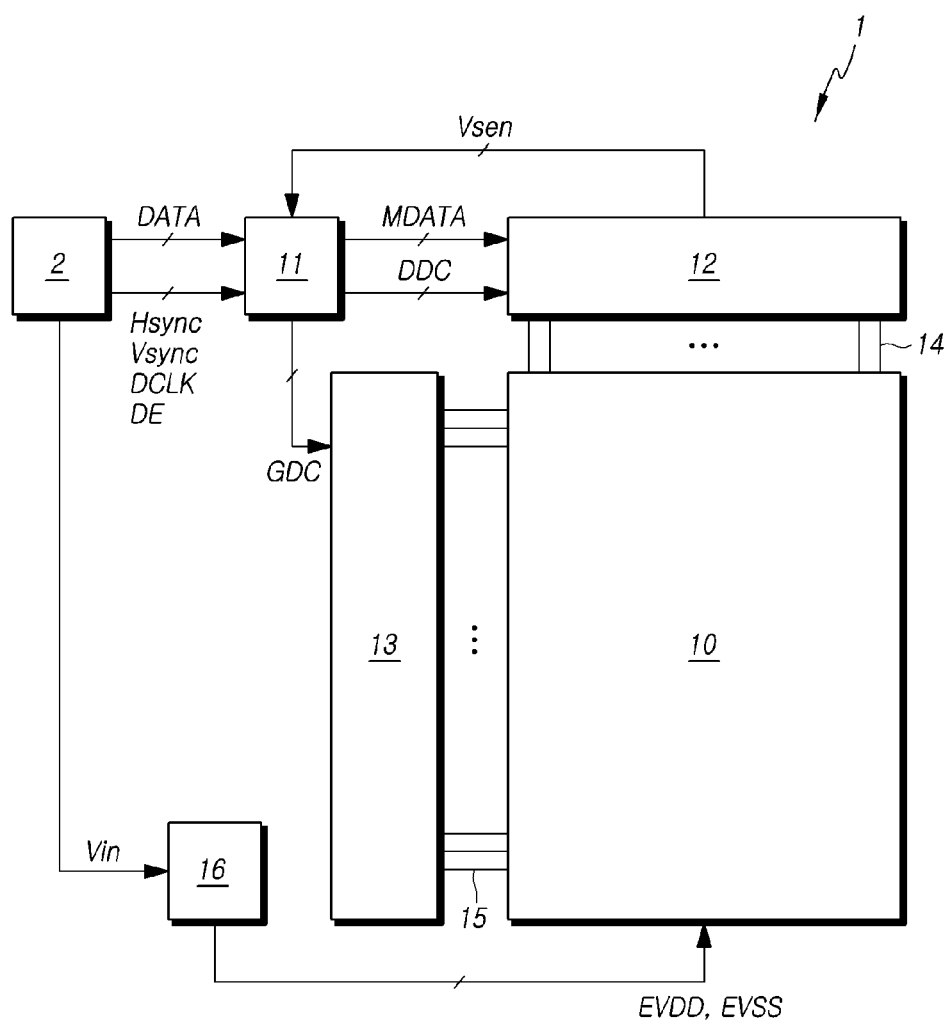
FIG. 1 illustrates schematically a display device according to aspects of the present disclosure.
Figure 2:
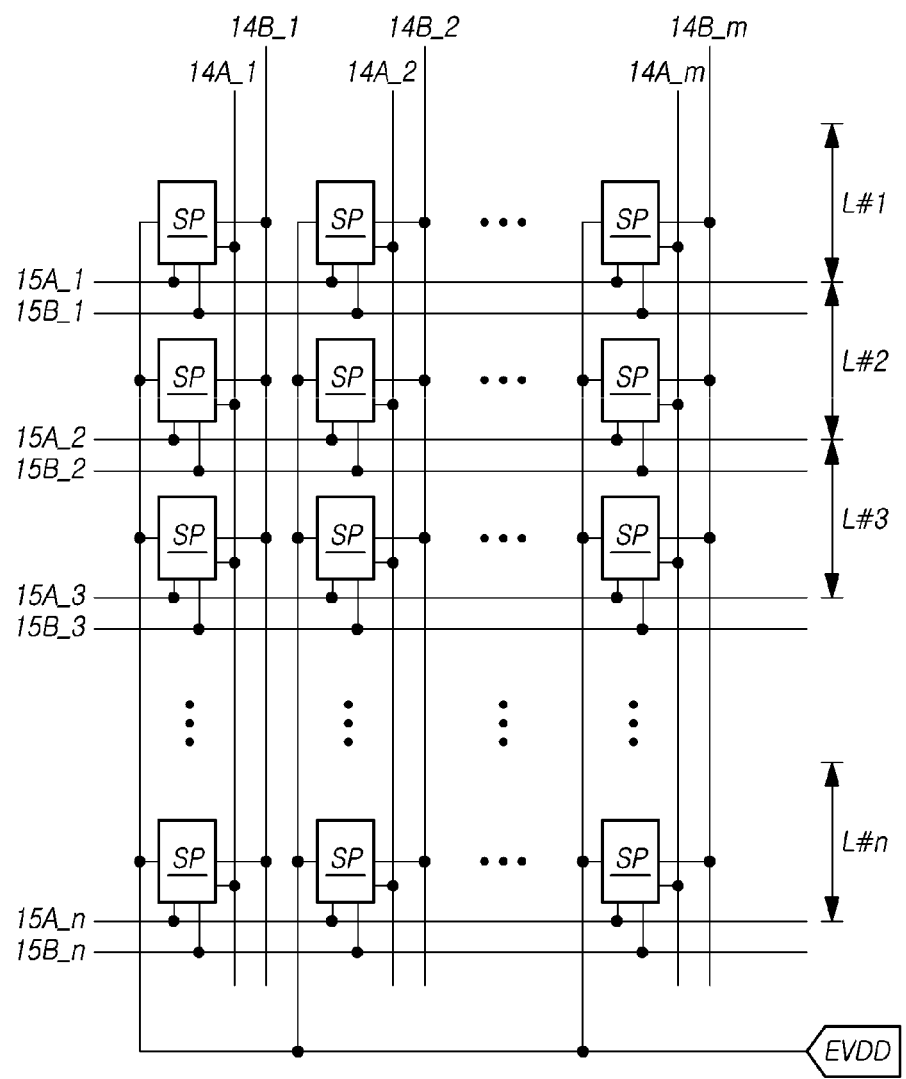
FIG. 2 illustrates an example subpixel array included in a display panel of the display device according to aspects of the present disclosure.

FIG. 1 illustrates schematically a display device according to aspects of the present disclosure. FIG. 2 illustrates an example subpixel array included in a display panel of the display device according to aspects of the present disclosure.

Referring to FIGS. 1 and 2, the display device 1 according to aspects of the present disclosure can include a display panel 10, a data driving circuit 12, a gate driving circuit 13, and a timing controller 11.

A plurality of data lines 14 and a plurality of gate lines 15 can be disposed to intersect each other in the display panel 10. A plurality of sub-pixels SP may be arranged in a matrix form at overlaps of the data lines 14 and the gate lines 15.

The data lines 14 may include m (m is a positive integer) data voltage supply lines (14A_1 to 14A_m) and m sensing voltage readout lines (14B_1 to 14B_m). The gate lines 15 may include n (n is a positive integer) first gate lines (15A_1 to 15A_n) and n second gate lines (15B_1 to 15B_n).

Each sub-pixel SP can be connected to any one of the data voltage supply lines (14A_1 to 14A_m), any one of the sensing voltage readout lines (14B_1 to 14B_m), and any one of the first gate lines (15A_1 to 15A_n), and any one of the second gate lines (15B_1 to 15B_n). Each sub-pixel SP can represent a color of predefined colors, and a predefined number of sub-pixels SP can be included in one pixel P.

Each sub-pixel SP can receive a data voltage through a data voltage supply line, receive a first gate signal through a first gate line, receive a second gate signal through a second gate line, and output a sensing voltage through a sensing voltage readout line.

That is, in a sub-pixel array shown in FIG. 2, sub-pixels SP can sequentially operate on one horizontal line (L #1 to L #n) basis in response to a first gate signal supplied on one horizontal line basis from first gate lines (15A_1 to 15A_n) and a second gate signal supplied on one horizontal line basis from second gate lines (15B_1 to 15B_n). Sub-pixels SP on an identical horizontal line which are driven for sensing operation can receive data voltages used for threshold voltage sensing from the data voltage supply lines (14A_1 to 14A_m), and output sensing voltages to the sensing voltage readout lines (14B_1 to 14B_m). Each of the first gate signal and the second gate signal may be a gate signal for sensing a threshold voltage or a gate signal for displaying an image; however, embodiments of the present disclosure are not limited thereto.

Each sub-pixel SP can receive at least one high voltage EVDD and at least one low voltage EVSS from a power management circuit 16. The sub-pixel SP may include an OLED, a driving transistor, first and second switching transistors, and a storage capacitor. In some embodiments, a light source other than the OLED may be included in the sub-pixel SP.

Transistors included in the sub-pixel SP may be p-type or n-type transistors. The semiconductor layers of the transistors included in the sub-pixel SP may include amorphous silicon, polysilicon, or oxide.

During image display operation, the data driving circuit 12 can convert compensated image data MDATA input from the timing controller 11 into data voltages for image display according to a data control signal DDC, and supply the data voltages resulting from the converting to the data voltage supply lines (14A_1 to 14A_m).

During sensing operation for sensing a threshold voltage of a driving transistor, the data driving circuit 12 can supply a data voltage for threshold voltage sensing to sub-pixels SP according to a first gate signal for threshold voltage sensing supplied on one horizontal line basis, convert sensing voltages input from the display panel 10 through the sensing voltage readout lines (14B_1 to 14B_m) into digital values, and supply the sensing values resulting from the converting to the timing controller 11.

The gate driving circuit 13 can generate a gate signal based on a gate control signal GDC. The gate signal may include a first threshold voltage sensing gate signal, a second threshold voltage sensing gate signal, a first image displaying gate signal, and a second image displaying gate signal.

During the sensing operation, the gate driving circuit 13 can supply the first threshold voltage sensing gate signal to the first gate lines (15A_1 to 15A_n) on one horizontal line basis, and the second threshold voltage sensing gate signal to the second gate lines (15B_1 to 15B_n) on one horizontal line basis. During the image display operation, the gate driving circuit 13 can supply the first image displaying gate signal to the first gate lines (15A_1 to 15A_n) on one horizontal line basis, and the second image displaying gate signal to the second gate lines (15B_1 to 15B_n) on one horizontal line basis. In one embodiment, the gate driving circuit 13 may be disposed in the display panel 10 in a gate-driver in panel (GIP) type.

The timing controller 11 can generate a data control signal DDC for controlling the operation timing of the data driving circuit 12 and a gate control signal GDC for controlling the operation timing of the gate driving circuit 13 based on timing signals such as a vertical synchronization signal Vsync, a horizontal synchronization signal Hsync, a dot clock signal DCLK, a data enable signal DE, and the like supplied from a host system 2. The timing controller 11 can compensate for the image data DATA supplied from the host system 2 using sensed values supplied from the data driving circuit 12, thereby, generate compensated image data MDATA for compensating for a difference in the threshold voltage of a driving transistor, and supply the compensated image data MDATA to the data driving circuit 12.

The power management circuit 16 can generate and supply several types of voltages needed to drive the display device 1 based on power supplied from the host system 2. In one embodiment, the power management circuit 16 can generate at least one driving voltage EVDD and at least one base voltage (EVSS) for driving each sub-pixel SP based on an input voltage Vin supplied from the host system 2, and supply the generated driving voltage EVDD and base voltage (EVSS) to the display panel 10. As another embodiment, the power management circuit 16 can generate at least one gate driving voltage GVDD and at least one gate base voltage GVSS for driving the gate driving circuit 13, and supply the generated gate driving voltage GVDD and the gate base voltage GVSS to the gate driving circuit 13.

Figure 3:
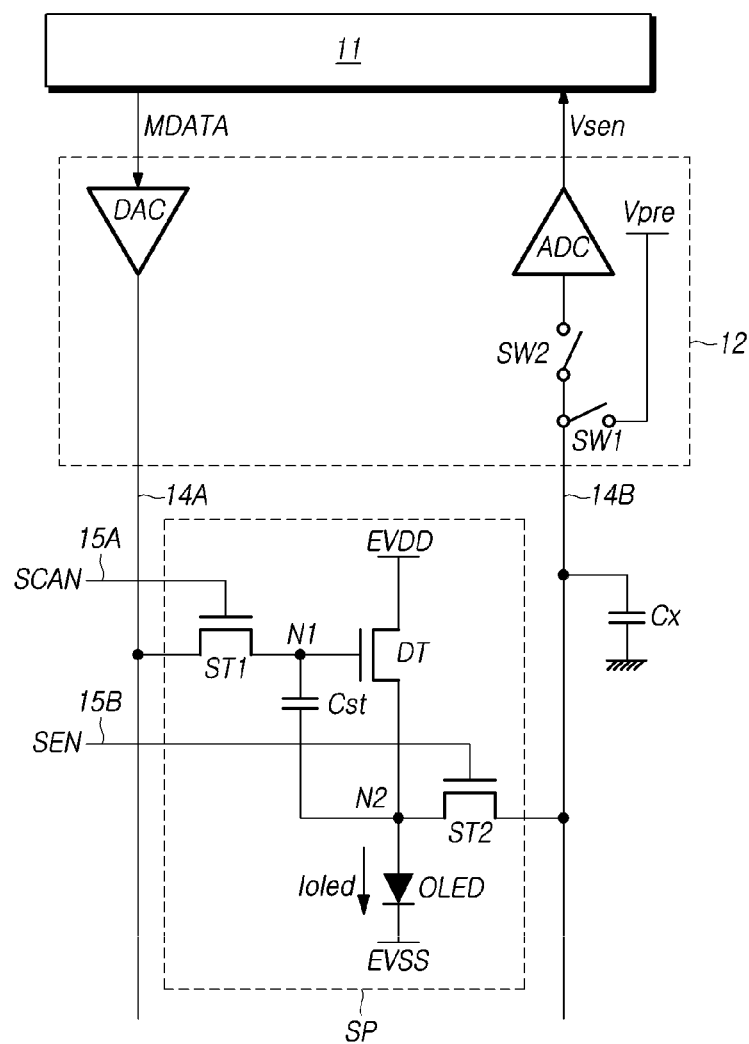
FIG. 3 illustrates an example circuit configuration of a sub-pixel, and an example connection structure between a timing controller, a data driving circuit, and the sub-pixel, in the display device according to aspects of the present disclosure.

FIG. 3 illustrates an example circuit configuration of the sub-pixel, and an example connection structure between the timing controller, the data driving circuit, and the sub-pixel, in the display device according to aspects of the present disclosure.

Referring to FIG. 3, the sub-pixel SP may include an OLED, a driving transistor DT, a storage capacitor Cst, a first switching transistor ST1, and a second switching transistor ST2.

The OLED can include an anode electrode connected to a second node N2, a cathode electrode connected to a low voltage supply line, or a terminal of a low power supply, for supplying a low level driving voltage EVSS, and an organic compound layer located between the anode electrode and the cathode electrode.

The driving transistor DT can be turned on depending on a gate-source voltage Vgs and control an amount of current Ioled flowing through the OLED. The driving transistor DT can include a gate electrode connected to the first node N1, a drain electrode connected to a high voltage supply line, or a terminal of a high power supply, for supplying a high level driving voltage EVDD, and a source electrode connected to a second node N2.

The storage capacitor Cst may be connected between the first node N1 and the second node N2.

During the sensing operation, the first switching transistor ST1 can apply a data voltage Vdata for threshold voltage sensing loaded on a data voltage supply line 14 to the first node N1 in response to the first threshold voltage sensing gate signal SCAN.

During the image display operation, the first switching transistor ST1 can apply a data voltage Vdata for image display loaded on the data voltage supply line 14A to the first node N1 in response to the first image displaying gate signal SCAN. The first switching transistor ST1 can include a gate electrode connected to the first gate line 15A, a drain electrode connected to the data voltage supply line 14A, and a source electrode connected to the first node N1.

During the sensing operation, the second switching transistor ST2 can control a current flow between the second node N2 and the sensing voltage readout line 14B in response to the second threshold voltage sensing gate signal SEN, and thereby enable a source voltage of the second node N2 varying by following a gate voltage at the first node N1 to be stored in a sensing capacitor Cx of the sensing voltage readout line 14B.

During the image display operation, the second switching transistor ST2 can control the current flow between the second node N2 and the sensing voltage readout line 14B in response to the second image displaying gate signal SEN, and thereby enable a source voltage of the driving transistor DT to be reset at an initialization voltage Vpre. The gate electrode, the drain electrode, and the source electrode of the second switching transistor ST2 can be connected to the second gate line 15B, the second node N2, and the sensing voltage readout line 14B, respectively.

The data driving circuit 12 can be connected to a sub-pixel SP through the data voltage supply line 14A and the sensing voltage readout line 14B. The sensing capacitor Cx for storing a source voltage at the second node N2 as a sensing voltage Vsen can be connected to the sensing voltage readout line 14B. The data driving circuit 12 can include a digital-to-analog converter (DAC), an analog-to-digital converter (ADC), an initialization switch SW1, and a sampling switch SW2.

In first and second periods of a sensing period, the DAC can generate data voltages Vdata for threshold voltage sensing with the same level or different levels by the control of the timing controller 11, and output the generated threshold voltage sensing data voltages Vdata to the data voltage supply line 14A. In an image display period, the DAC can convert compensated image data MDATA into a data voltage Vdata for image display, and output the data voltage resulting from the converting to the data voltage supply line 14A.

The initialization switch SW1 can control a current flow between an initialization voltage supply line, or a terminal of an initialization power supply, for supplying an initialization voltage Vpre and the sensing voltage readout line 14B. The sampling switch SW2 can control a current flow between the sensing voltage readout line 14B and the ADC. The ADC can convert an analog sensing voltage Vsen stored in the sensing capacitor Cx into a digital sensing value and supply the sensing value resulting from the converting to the timing controller 11.

The sensing operation performed by the control of the timing controller 11 is as follows. When the threshold voltage sensing first and second gate signals SCAN and SEN with a turn-on level Lon are applied to the sub-pixel SP, the first switching transistor ST1 and the second switching transistor ST2 can be turned on. At this time, the initialization switch SW1 of the data driving circuit 12 can be also turned on.

When the first switching transistor ST1 is turned on, a data voltage Vdata for threshold voltage sensing can be supplied to the first node N1. When the initialization switch SW1 and the second switching transistor ST2 are turned on, an initialization voltage Vpre can be supplied to the second node N2. At this time, as a gate-source voltage Vgs of the driving transistor DT becomes greater than the threshold voltage Vth thereof, a current Ioled can flow between the drain and the source of the driving transistor DT. The source voltage VN2 of the driving transistor DT charged in the second node N2 by such a current Ioled gradually increases, and thus, the source voltage VN2 of the driving transistor DT follows the gate voltage VN1 of the driving transistor DT until the gate-source voltage Vgs of the driving transistor DT reaches the threshold voltage Vth.

The source voltage VN2 of the driving transistor DT increasing at the second node N2 can be stored, as a sensing voltage Vsen, to the sensing capacitor Cx formed on the sensing voltage readout line 14B via the second switching transistor ST2. The sensing voltage Vsen can be detected when the sampling switch SW2 in the data driving circuit 12 is turned on within a sensing period in which the second threshold voltage sensing gate signal SEN is maintained at the turn-on level, and be supplied to the ADC.

The ADC can convert the analog sensing voltage Vsen stored in the sensing capacitor Cx into a digital sensing value and supply the sensing value resulting from the converting to the timing controller 11.

In one embodiment, the timing controller 11 can control the data driving circuit 12 and the gate driving circuit 13 so that a sensing operation for one horizontal line can be performed in a period (i.e., a blank period) between a period in which one frame of image data is displayed by the image display operation, that is, an image display period, and a subsequent period in which a subsequent one frame of image data is displayed.

The timing controller 11 can compensate for image data based on a sensed value obtained by the data driving circuit 12 and generate the compensated image data MDATA resulting from the compensation. As the compensated image data MDATA is supplied to the data driving circuit 12, an image based on the compensated image data MDATA can be displayed on the display panel 10.

Figure 4:
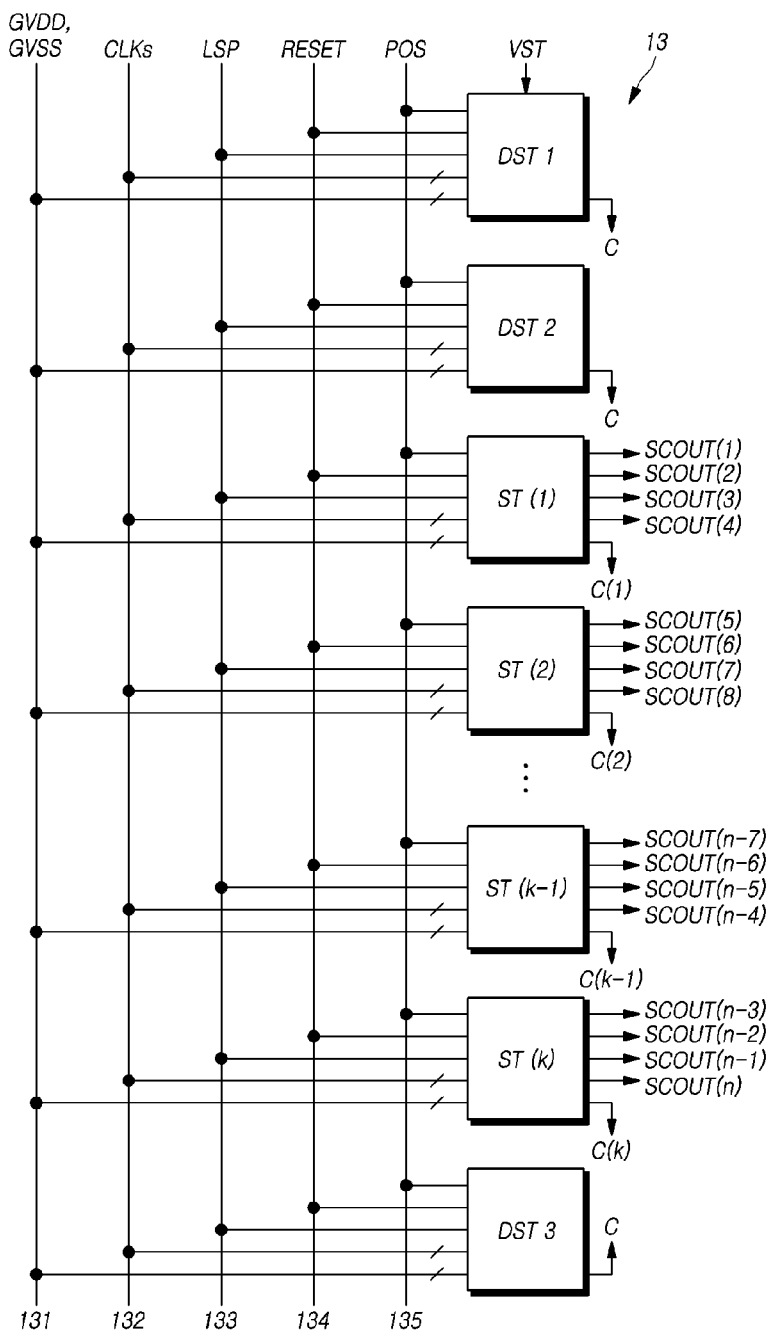
FIG. 4 illustrates an example configuration of a plurality of stage circuits included in a gate driving circuit according to aspects of the present disclosure.

FIG. 4 illustrates an example configuration of a plurality of stage circuits included in the gate driving circuit according to aspects of the present disclosure.

Referring to FIG. 4, the gate driving circuit 13 according to aspects of the present disclosure can include first to k-th stage circuits (ST(1) to ST(k)) (k is a positive integer), a gate driving voltage line 131, a clock signal line 132, a line sensing preparation signal line 133, and a reset signal line 134. Further, the gate driving circuit 13 can include one or more preceding dummy stage circuits (DST1, DST2) disposed at one or more preceding stages of the first stage circuit ST(1) and at least one following dummy stage circuit DST3 disposed at least one following stage of the k-th stage circuit ST(k). However, the structure of the gate driving circuit is not limited thereto. For example, the at least one following dummy stage circuit DST3 may be omitted. For another example, the number of the preceding dummy stage circuits is not limited to that shown in FIG. 4.

The gate driving voltage line 131 can supply at least one high voltage GVDD and at least one low voltage GVSS supplied from a power supply (not shown) to the first to kth stage circuits (ST(1) to ST(k)), the preceding dummy stage circuits (DST1, DST2), and the following dummy stage circuit DST3.

In one embodiment, the gate driving voltage line 131 can include a plurality of high voltage lines, which supply respective high voltages different from one another, and a plurality of low voltage lines, which supply respective low voltages different from one another.

For example, the gate driving voltage line 131 may include three high voltage lines for supplying a first high voltage GVDD1, a second high voltage GVDD2, and a third high voltage GVDD3, each of which has a different voltage level from one another, and three low voltage lines for supplying a first low voltage GVSS1, a second low voltage GVSS2, and a third low voltage GVSS3, each of which has a different voltage level from one another. However, this is only one example, and the number of lines included in the gate driving voltage line 131 may vary according to embodiments.

The clock signal line 132 can supply clock signals CLKs supplied from the timing controller 11, for example, a carry clock signal CRCLK, a scan clock signal SCCLK, and/or the like to the first to kth stage circuits (ST(1) to ST(k)), the preceding dummy stage circuits (DST1, DST2), and the following dummy stage circuit DST3.

The line sensing preparation signal line 133 can supply a line sensing preparation signal LSP supplied from the timing controller 11 to the first to kth stage circuits (ST(1) to ST(k)). Alternatively, the line sensing preparation signal line 133 may be connected to the preceding dummy stage circuits (DST1, DST2).

The reset signal line 134 can supply a reset signal RESET supplied from the timing controller 11 to the first to kth stage circuits (ST(1) to ST(k)), the preceding dummy stage circuits (DST1, DST2), and the following dummy stage circuit DST3.

A panel-on signal line 135 can supply a panel-on signal POS supplied from the timing controller 11 to the first to kth stage circuits (ST(1) to ST(k)), the preceding dummy stage circuits (DST1, DST2), and the following dummy stage circuit DST3.

Although not shown, lines for supplying different signals other than the lines (131, 132, 133, and 134) shown in FIG. 4 may be further connected to the first to kth stage circuits (ST(1) to ST(k)), the preceding dummy stage circuits (DST1, DST2), and the following dummy stage circuit DST3. For example, a line for supplying a start signal VST to the preceding dummy stage circuits (DST1, DST2) may be additionally connected to the preceding dummy stage circuits (DST1, DST2).

The preceding dummy stage circuits (DST1, DST2) can output a preceding stage carry signal C in response to the input of the start signal VST supplied from the timing controller 124. The preceding stage carry signal C may be supplied to any one of the first to kth stage circuits (ST(1) to ST(k)). The preceding stage carry signal C may be supplied to a following stage dummy stage circuit (e.g., DST2) of the preceding dummy stage circuits (DST1, DST2).

The following dummy stage circuit DST3 can output a following stage carry signal C. The following stage carry signal C may be supplied to any one of the first to kth stage circuits (ST(1) to ST(k)).

The first to k-th stage circuits (ST(1) to ST(k)) may be connected to one another in a stepped or cascaded manner, and also be connected to the dummy stage circuits (DST1 to DST3) in the stepped or cascaded manner.

In one embodiment, each of the first to kth stage circuits (ST(1) to ST(k) can output j (j is a positive integer) gate signals SCOUT and one carry signal C. That is, any of the first to k-th stage circuits (ST(1) to ST(k)) can output the first to j-th gate signals and one carry signal C.

For example, in the embodiment shown in FIG. 4, each stage circuit can output four gate signals SCOUT and one carry signal C. For example, the first stage circuit ST(1) can output a first gate signal SCOUT(1), a second gate signal SCOUT(2), a third gate signal SCOUT(3), a fourth gate signal SCOUT(4), and a first carry signal C(1), and the second stage circuit ST(2) can output a fifth gate signal SCOUT(5), a sixth gate signal SCOUT(6), a seventh gate signal SCOUT(7), an eighth gate signal SCOUT(8), and a second carry signal C(2). Accordingly, in the embodiment of FIG. 4, j equals to 4.

The number of gate signals output from the first to k-th stage circuits (ST(1) to ST(k)) may equal to the number n of gate lines 15 disposed in the display panel 10. As described above, each stage circuit can output j gate signals. Therefore, the relation of j×k=n is established.

For example, since j=4 in the embodiment shown in FIG. 4, the number k of the stage circuits equals to ¼ of the number n of the gate lines 15. That is, k=n/4 in the embodiment of FIG. 4.

However, the number of gate signals output by each stage circuit according to embodiments of the present disclosure is not limited thereto. That is, in some embodiments, each stage circuit may output one, two, or three gate signals, or may output five or more gate signals. The number of stage circuits may vary depending on the number of gate signals output by each stage circuit.

In description that follow, discussions are conducted based on an embodiment in which each stage circuit outputs four gate signals SCOUT and one carry signal C; however, embodiments of the present disclosure are not limited thereto.

Gate signals SCOUT output from the first to kth stage circuits (ST(1) to ST(k)) may be gate signals for threshold voltage sensing or gate signals for image display. Carry signals C output from the first to kth stage circuits (ST(1) to ST(k)) may be supplied to different stage circuits from one another. Herein, a carry signal supplied from a preceding stage circuit to any stage circuit is referred to as a preceding stage carry signal, and a carry signal supplied from a following stage circuit to the stage circuit is referred to as a following stage carry signal.

Figure 5:
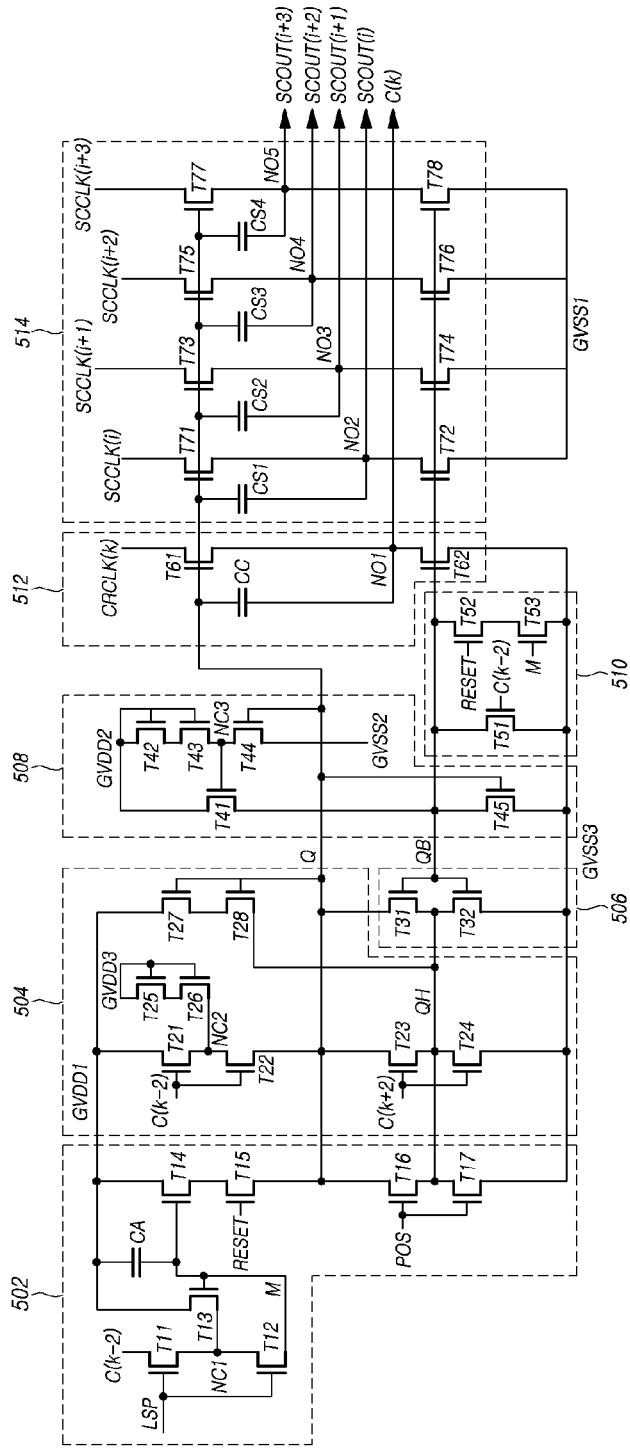
FIG. 5 is an example circuit diagram of the stage circuit included in the gate driving circuit according to aspects of the present disclosure.

FIG. 5 is an example circuit diagram of the stage circuit included in the gate driving circuit according to aspects of the present disclosure.

The stage circuit shown in FIG. 5 is any one of the first to kth stage circuits (ST(1) to ST(k)) shown in FIG. 4.

Referring to FIG. 5, in one embodiment, the stage circuit may include an M node, a Q node, a QB node, and a QH node. In one embodiment, the stage circuit can include a line selector 502, a Q node controller 504, a Q node and QH node stabilizing circuit 506, an inverter 508, a QB node stabilizing circuit 510, a carry signal output circuit 512, and a gate signal output circuit 514.

The line selector 502 can charge the M node based on a preceding stage carry signal C(k−2) in response to the input of a line sensing preparation signal LSP. The line selector 502 can charge the Q node to a first high voltage (GVDD1) level based on a charged voltage at the M node in response to the input of a reset signal RESET. The line selector 502 can discharge or reset the Q node to a third low voltage (GVSS3) level in response to the input of a panel-on signal POS.

The line selector 502 can include first to seventh transistors T11 to T17 and a precharging capacitor CA.

The first transistor T11 and the second transistor T12 may be connected between the M node and a preceding stage carry signal C(k−2) line for delivering a preceding stage carry signal C(k−2). The first transistor T11 and the second transistor T12 may be connected in series with each other.

The first transistor T11 can output a preceding stage carry signal C(k−2) to a first connection node NC1 in response to the input of a line sensing preparation signal LSP. The second transistor T12 can electrically connects the first connection node NC1 to the M node in response to the input of the line sensing preparation signal LSP. For example, when the line sensing preparation signal LSP having a high voltage is input to the first transistor T11 and the second transistor T12, the first transistor T11 and the second transistor T12 can be simultaneously turned on, thereby, enabling the M node to be charged to the first high voltage (GVDD1) level.

The third transistor T13 can be turned on when the voltage level of the M node is at a high level and supply the first high voltage GVDD1 to the first connection node NC1. When the first high voltage GVDD1 is supplied to the first connection node NC1, a voltage difference between the gate voltage of the first transistor T11 and the voltage of the first connection node NC1 can increase. Thereafter, when the line sensing preparation signal LSP having a low level is input to the gate of the first transistor T11, and thereby, the first transistor T11 is turned off, the first transistor T11 can completely remain in the turned-off state due to a voltage difference between the gate voltage of the first transistor T11 and the voltage of the first connection node NC1. Thus, the current leakage of the first transistor T11 and the voltage drop of the M node caused by the current leakage of the first transistor T11 can be prevented, this enabling the voltage of the M node to be stably maintained.

The precharging capacitor CA can be connected between a first high voltage line for transmitting the first high voltage GVDD1 and the M node, and store a difference voltage between the first high voltage GVDD1 and a voltage charged in the M node. When the first transistor T11, the second transistor T12, and the third transistor T13 are turned on, the precharging capacitor CA can store a high voltage of the preceding stage carry signal C(k−2). When the first transistor T11, the second transistor T12, and the third transistor T13 are turned off, the precharging capacitor CA can maintain the voltage of the M node at the stored voltage for a predetermined time.

The fourth transistor T14 and the fifth transistor T15 can be connected between the first high voltage line for transmitting the first high voltage GVDD1 and the Q node. The first transistor T14 and the second transistor T15 can be connected in series with each other.

The fourth transistor T14 and the fifth transistor T15 can charge the Q node to the first high voltage GVDD1 in response to the voltage of the M node and the input of a reset signal RESET. The fourth transistor T14 can be turned on when the voltage of the M node is at the high level, and transmit the first high voltage GVDD1 to a shared node of the fourth transistor T14 and the fifth transistor T15. The fifth transistor T15 can be turned on by the reset signal RESET having a high level, and supply the voltage of the shared node to the Q node. Accordingly, when the fourth transistor T14 and the fifth transistor T15 are simultaneously turned on, the Q node can be charged to the first high voltage GVDD1.

The sixth transistor T16 and the seventh transistor T17 can be connected between the Q node and a third low voltage line for transmitting a third low voltage GVSS3. The sixth transistor T16 and the seventh transistor T17 can be connected in series with each other.

The sixth transistor T16 and the seventh transistor T17 can discharge the Q node to the third low voltage GVSS3 in response to the input of a panel-on signal POS. The discharging of the Q node to the third low voltage GVSS3 may also be expressed as the resetting of the Q node. The seventh transistor T17 can be turned on by the input of the panel-on signal POS having a high level and supply the third low voltage GVSS3 to the QH node. The sixth transistor T16 can be turned on by the input of the panel-on signal POS having the high level and electrically connect the Q node and the QH node. Accordingly, when the fourth transistor T16 and the fifth transistor T17 are simultaneously turned on, the Q node can be discharged or reset to the third low voltage GVSS3.

The Q node controller 504 can charges the Q node to the first high voltage (GVDD1) level in response to the input of the preceding stage carry signal C(k−2), and discharge the Q node to the third low voltage GVSS3 in response to the input of a following stage carry signal C(k+2).

The Q node controller 504 may include first to eighth transistors T21 to T28.

The first transistor T21 and the second transistor T22 can be connected between the first high voltage line for transmitting the first high voltage GVDD1 and the Q node. The first transistor T21 and the second transistor T22 can be connected in series with each other.

The first transistor T21 and the second transistor T22 can charge the Q node to the first high voltage (GVDD1) level in response to the input of the preceding stage carry signal C(k−2). The first transistor T21 can be turned on by the input of the preceding stage carry signal C(k−2) and supply the first high voltage GVDD1 to a second connection node NC2. The second transistor T22 can be turned on by the input of the preceding stage carry signal C(k−2) and electrically connect the second connection node NC2 and the Q node. Accordingly, when the first transistor T21 and the second transistor T22 are simultaneously turned on, the first high voltage GVDD1 can be supplied to the Q node.

The fifth transistor T25 and the sixth transistor T26 can be connected to a third high voltage line for transmitting a third high voltage GVDD3. The fifth transistor T25 and the sixth transistor T26 can supply the third high voltage GVDD3 to the second connection node NC2 in response to the third high voltage GVDD3.

As the fifth transistor T25 and the sixth transistor T26 can be simultaneously turned on by the third high voltage GVDD3, a voltage difference between the gate voltage of the first transistor T21 and the voltage of the second connection node NC2 can increase by enabling the third high voltage GVDD3 to be constantly supplied to the second connection node NC2. Thus, when the preceding stage carry signal C(k−2) having a low level is input to the gate of the first transistor T21, and thereby, the first transistor T21 is turned off, the first transistor T21 can completely remain in the turned-off state due to a voltage difference between the gate voltage of the first transistor T21 and the voltage of the second connection node NC2. Thus, the current leakage of the first transistor T21 and the voltage drop of the Q node caused by the current leakage of the first transistor T21 can be prevented, this enabling the voltage of the Q node to be stably maintained.

For example, when the threshold voltage of the first transistor T21 is negative polarity (−), the gate-source voltage Vgs of the first transistor T21 can be maintained as negative polarity (−) by the third high voltage GVDD3 supplied to the drain electrode thereof. Thus, the preceding stage carry signal C(k−2) having the low level is input to the gate of the first transistor T21, and thereby, the first transistor T21 is turned off, the first transistor T21 can completely remain in the turned-off state and the occurrence of corresponding leakage current can be prevented.

In one embodiment, the third high voltage GVDD3 may be set to a voltage level lower than the first high voltage GVDD1.

The third transistor T23 and the fourth transistor T24 can be connected between the Q node and the third low voltage line for transmitting the third low voltage GVSS3. The third transistor T23 and the fourth transistor T24 can be connected in series with each other.

The third transistor T23 and the fourth transistor T24 can discharge the Q node and the QH node to the third low voltage GVSS3 in response to the input of the following stage carry signal C(k+2). The fourth transistor T24 can be turned on by the input of the following stage carry signal C(k+2) and discharge the QH node to the third low voltage GVSS3. The third transistor T23 can be turned on by the input of the following stage carry signal C(k+2) and electrically connect the Q node and the QH node. Accordingly, when the third transistor T23 and the fourth transistor T24 are simultaneously turned on, the Q node and the QH node can be discharged or reset to the third low voltage GVSS3.

The seventh transistor T27 and the eighth transistor T28 can be connected between the first high voltage line for transmitting the first high voltage GVDD1 and the Q node and between the first high voltage line for transmitting the first high voltage GVDD1 and the QH node. The seventh transistor T27 and the eighth transistor T28 can be connected in series with each other.

The seventh transistor T27 and the eighth transistor T28 can supply the first high voltage GVDD1 to the QH node in response to the voltage of the Q node. The fourth transistor T27 can be turned on when the voltage of the Q node is at a high level, and supply the first high voltage GVDD1 to a shared node of the seventh transistor T27 and the eighth transistor T28. The eighth transistor T28 can be turned on when the voltage of the Q node is at the high level and electrically connect the shared node and the QH node. Thus, the seventh transistor T27 and the eighth transistor T28 can be simultaneously turned on when the voltage of the Q node is at the high level and supply the first high voltage GVDD1 to the QH node.

When the first high voltage GVDD1 is supplied to the QH node, a voltage difference between the gate of the third transistor T23 and the QH node can increase. Thus, the following stage carry signal C(k+2) having a low level is input to the gate of the third transistor T23, and thereby, the third transistor T23 is turned off, the third transistor T23 can completely remain in the turned-off state due to a voltage difference between the gate voltage of the third transistor T23 and the voltage of the QH node. Thus, the current leakage of the third transistor T23 and the voltage drop of the Q node caused by the current leakage of the third transistor T23 can be prevented, this enabling the voltage of the Q node to be stably maintained.

The Q node and QH node stabilizing circuit 506 can discharge the Q node and the QH node to the third low voltage (GVSS3) level in response to the voltage of the QB node.

The Q node and QH node stabilizing circuit 506 may include a first transistor T31 and a second transistor T32. The first transistor T31 and the second transistor T32 can be connected between the Q node and the third low voltage line for transmitting the third low voltage GVSS3. The first transistor T31 and the second transistor T32 can be connected in series with each other.

The first transistor T31 and the second transistor T32 can discharge the Q node and the QH node to the third low voltage GVSS3 in response to the voltage of the QB node. The second transistor T32 can be turned on when the voltage of the QB node is at a high level and supply the third low voltage GVSS3 to a shared node of the first transistor T31 and the second transistor T32. The first transistor T31 can be turned on when the voltage of the QB node is at the high level and electrically connect the Q node and the QH node. Accordingly, when the first transistor T31 and the second transistor T32 are simultaneously turned on by the voltage of the QB node, the Q node and the QH node can be discharged or reset to the third low voltage GVSS3.

The inverter 508 can change a voltage level of the QB node according to a voltage level of the Q node.

The inverter 508 may include first to fifth transistors T41 to T45.

The second transistor T42 and the third transistor T43 can be connected between a second high voltage line for transmitting a second high voltage GVDD2 and a third connection node NC3. The second transistor T42 and the third transistor T43 can be connected in series with each other.

The second transistor T42 and the third transistor T43 can supply the second high voltage GVDD2 to the third connection node NC3 in response to the second high voltage GVDD2. The second transistor T42 can be turned on by the second high voltage GVDD2 and supply the second high voltage GVDD2 to the shared node of the second transistor T42 and the third transistor T43. The third transistor T43 can be turned on by the second high voltage GVDD2 and electrically connect the shared node of the second transistor T42 and the third transistor T43 and the third connection node NC3. Accordingly, when the second transistor T42 and the third transistor T43 are simultaneously turned on by the second high voltage GVDD2, the third connection node NC3 can be charged to the second high voltage (GVDD2) level.

The fourth transistor T44 can be connected between the third connection node NC3 and a second low voltage line for transmitting a second low voltage GVSS2.

The fourth transistor T44 can supply the second low voltage GVSS2 to the third connection node NC3 in response to the voltage of the Q node. The fourth transistor T44 can be turned on when the voltage of the Q node is at the high level and discharge or reset the third connection node NC3 to the second low voltage GVSS2.

The first transistor T41 can be connected between the second high voltage line for transmitting the second high voltage GVDD2 and the QB node.

The first transistor T41 can supply the second high voltage GVDD2 to the QB node in response to the voltage of the third connection node NC3. The first transistor T41 can be turned on when the voltage of the third connection node NC3 is at the high level and charge the QB node to the second high voltage (GVDD2) level.

The fifth transistor T45 can be connected between the QB node and the third low voltage line for transmitting the third low voltage GVSS3.

The fifth transistor T45 can supply the third low voltage GVSS3 to the QB node in response to the voltage of the Q node. The fifth transistor T45 can be turned on when the voltage of the Q node is at the high level and discharge or reset the QB node to the third low voltage GVSS3 level.

The QB node stabilizing circuit 510 can discharge the QB node to the third low voltage GVSS3 in response to the input of the preceding stage carry signal C(k−2), the input of the reset signal, and the charged voltage of the M node.

The QB node stabilizing circuit 510 may include first to third transistors T51 to T53.

The first transistor T51 can be connected between the QB node and the third low voltage line for transmitting the third low voltage GVSS3.

The first transistor T51 can supply the third low voltage GVSS3 to the QB node in response to the input of the preceding stage carry signal C(k−2). The first transistor T51 can supply the third low voltage GVSS3 to the QB node when the preceding stage carry signal C(k−2) having the high level is input to the gate thereof.

The second transistor T52 and the third transistor T53 can be connected between the QB node and the third low voltage line for transmitting the third low voltage GVSS3. The second transistor T52 and the third transistor T53 can be connected in series with each other.

The second transistor T52 and the third transistor T53 can discharge the QB node to the third low voltage GVSS3 level in response to the input of the reset signal and the charged voltage of the M node. The third transistor T53 can be turned on when the voltage of the M node is at the high level and supply the third low voltage GVSS3 to a shared node of the second transistor T52 and the third transistor T53. The second transistor T52 can be turned on by the input of the reset signal RESET and electrically connect the shared node of the second transistor T52 and the third transistor T53 and the QB node. Accordingly, when the reset signal RESET is input at the high level of the voltage of the M node, the second transistor T52 and the third transistor T53 can be simultaneously turned on and enable the QB node to be discharged or reset to the third low voltage GVSS3.

The carry signal output circuit 512 can output a carry signal C(k) based on a voltage level of a carry clock signal CRCLK(k) according to the voltage level of the Q node or the third low voltage (GVSS3) level according to the voltage level of the QB node.

The carry signal output circuit 512 may include a first transistor T61, a second transistor T62, and a boosting capacitor CC.

The first transistor T61 can be connected between a clock signal line for transmitting the carry clock signal CRCLK(k) and a first output node NO1. The boosting capacitor CC can be connected between the gate and the source of the first transistor T61.

The first transistor T61 can output the carry signal C(k) having a high voltage through the first output node NO1 based on the carry clock signal CRCLK(k) in response to the voltage of the Q node. The first transistor T61 can be turned on when the voltage of the Q node is at the high level and supply the carry clock signal CRCLK(k) having the high voltage to the first output node NO1. Accordingly, the carry signal C(k) having the high voltage can be output.

When the carry signal C(k) is output, the boosting capacitor CC can bootstrap the voltage of the Q node until reaching a boosting voltage level greater than the first high voltage GVDD1 in sync with the carry clock signal CRCLK(k) with the high voltage level. When the voltage of the Q node is bootstrapped, the carry clock signal CRCLK(k) having the high voltage level can be output as the carry signal C(k) quickly and without distortion.

The second transistor T62 can be connected between the first output node NO1 and the third low voltage line for transmitting the third low voltage GVSS3.

The second transistor T62 can output the carry signal C(k) having a low voltage through the first output node NO1 based on the third low voltage GVSS3 in response to the voltage of the QB node. The second transistor T62 can be turned on when the voltage of the QB node is at a high level and supply the third low voltage GVSS3 to the first output node NO1. Accordingly, the carry signal C(k) having the low voltage can be output.

The gate signal output circuit 514 can output a plurality of gate signals (SCOUT(i), SCOUT(i+1), SCOUT(i+2), SCOUT(i+3)) based on voltage levels of a plurality of scan clock signals (SCCLK(i), SCCLK(i+1), SCCLK(i+2), SCCLK(i+3)) or a first low voltage GVSS1 according to the voltage level of the Q node or the voltage level of the QB node, where i is a positive integer.

The gate signal output circuit 514 may include first to eighth transistors T71 to T78 and boosting capacitors (CS1, CS2, CS3, CS4).

The first transistor T71, the third transistor T73, the fifth transistor T75, and the seventh transistor T77 can be respectively connected to clock signal lines for transmitting the scan clock signals (SCCLK(i), SCCLK(i+1), SCCLK(i+2), SCCLK(i+3)) and second to fifth output nodes NO2 to NO5. Boosting capacitors (CS1, CS2, CS3, CS4) can be respectively connected between the gates and sources of the first transistor T71, the third transistor T73, the fifth transistor T75, and the seventh transistor T77.

The first transistor T71, the third transistor T73, the fifth transistor T75, and the seventh transistor T77 can respectively output gate signals having a high voltage (SCOUT(i), SCOUT(i+1), SCOUT(i+2), SCOUT(i+3)) through the second output node NO2, the third output node NO3, the fourth output node NO4, and the fifth output node NO5 based on the scan clock signals (SCCLK(i), SCCLK(i+1), SCCLK(i+2), SCCLK(i+3)) in response to the voltage of the Q node. The first transistor T71, the third transistor T73, the fifth transistor T75, and the seventh transistor T77 can be turned on when the voltage of the Q node is at the high level, and respectively supply scan clock signals having a high voltage (SCCLK(i), SCCLK(i+1), SCCLK(i+2), SCCLK(i+3)) to the second output node NO2, the third output node NO3, the fourth output node NO4, and the fifth output node NO5. Accordingly, the gate signals having the high voltage (SCOUT(i), SCOUT(i+1), SCOUT(i+2), SCOUT(i+3)) can be output.

When the gate signals (SCOUT(i), SCOUT(i+1), SCOUT(i+2), SCOUT(i+3)) are output, the boosting capacitors (CS1, CS2, CS3, CS4) can bootstrap or increase the voltage of the Q node until reaching a boosting voltage level greater than the first high voltage GVDD1 in sync with the high level scan clock signals (SCCLK(i), SCCLK(i+1), SCCLK(i+2), SCCLK(i+3)). When the voltage of the Q node is bootstrapped, scan clock signals having the high voltage level ((SCCLK(i), SCCLK(i+1), SCCLK(i+2), SCCLK(i+3)) can be output as gate signals (SCOUT(i), SCOUT(i+1), SCOUT(i+2), SCOUT(i+3)) quickly and without distortion.

The second transistor T72, the fourth transistor T74, the sixth transistor T76, and the eighth transistor T78 can respectively output gate signals having a low voltage (SCOUT(i), SCOUT(i+1), SCOUT(i+2), SCOUT(i+3)) through the second output node NO2, the third output node NO3, the fourth output node NO4, and the fifth output node NO5 based on the first low voltage GVSS1 in response to the voltage of the QB node. The second transistor T72, the fourth transistor T74, the sixth transistor T76, and the eighth transistor T78 can be turned on when the voltage of the Q node is at the high level, and respectively supply the first low voltage GVSS1 to the second output node NO2, the third output node NO3, the fourth output node NO4, and the fifth output node NO5. Accordingly, the gate signals having the low voltage (SCOUT(i), SCOUT(i+1), SCOUT(i+2), SCOUT(i+3)) can be output.

In the embodiment shown in FIG. 5, the three high voltages (GVDD1, GVDD2, GVDD3) having different levels from one another, and the three low voltages (GVSS1, GVSS2, GVSS3) having different levels from one another, can be supplied to each of the stage circuits. For example, the first high voltage GVDD1, the second high voltage GVDD2, and the third high voltage GVDD3 may be set to 20V, 16V, and 14V, respectively, and the first low voltage GVSS1, the second low voltage GVSS2, and the third low voltage GVSS3 may be set to −6V, −10V, and −12V, respectively. However, these figures are only examples, and the levels of the high voltages and the low voltages may be set differently depending on embodiments.

Figure 6:
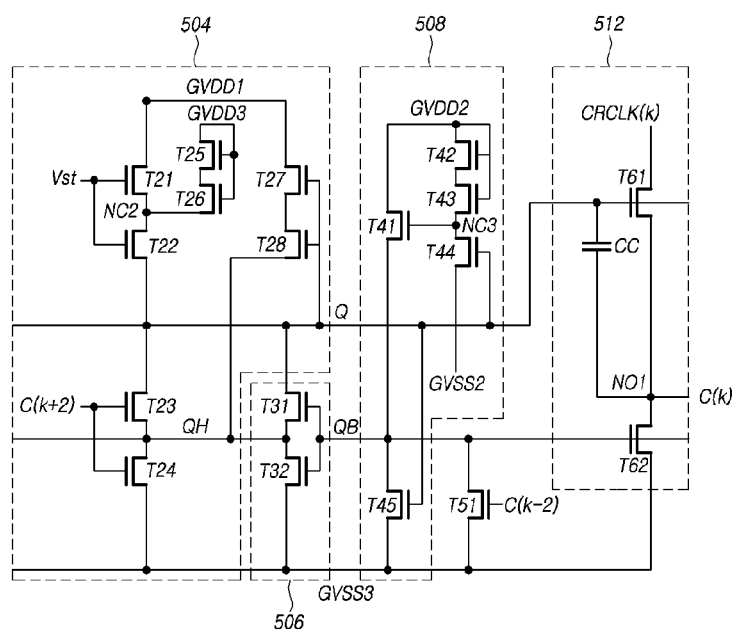
FIG. 6 is an example circuit diagram of a dummy stage circuit included in the gate driving circuit according to aspects of the present disclosure.

FIG. 6 is an example circuit diagram of a dummy stage circuit included in the gate driving circuit according to aspects of the present disclosure.

The dummy stage circuit shown in FIG. 6 is a circuit diagram of the preceding dummy stage circuit DST1 shown in FIG. 4.

Referring to FIG. 6, in one embodiment, the preceding dummy stage circuit DST1 may include an Q node, a QB node, and a QH node. In one embodiment, the preceding dummy stage circuit DST1 may include a Q node controller 504, a Q node and QH node stabilizing circuit 506, an inverter 508, and a carry signal output circuit 512.

The Q node controller 504 can charges the Q node to a first high voltage (GVDD1) level in response to the input of a start signal Vst for the initialization of an RT sensing line, and discharge the Q node to a third low voltage GVSS3 in response to the input of a following stage carry signal C(k+2).

The Q node controller 504 may include first to eighth transistors T21 to T28.

The first transistor T21 and the second transistor T22 can be connected between a first high voltage line for transmitting the first high voltage GVDD1 and the Q node. The first transistor T21 and the second transistor T22 can be connected in series with each other.

The first transistor T21 and the second transistor T22 can charge the Q node to the first high voltage (GVDD1) level in response to the input of a preceding stage carry signal C(k−2). The first transistor T21 can be turned on by the input of the preceding stage carry signal C(k−2) and supply the first high voltage GVDD1 to a second connection node NC2. The second transistor T22 can be turned on by the input of the preceding stage carry signal C(k−2) and electrically connect the second connection node NC2 and the Q node. Accordingly, when the first transistor T21 and the second transistor T22 are simultaneously turned on, the first high voltage GVDD1 can be supplied to the Q node.

The fifth transistor T25 and the sixth transistor T26 can be connected to a third high voltage line for transmitting a third high voltage GVDD3. The fifth transistor T25 and the sixth transistor T26 can supply the third high voltage GVDD3 to the second connection node NC2 in response to the third high voltage GVDD3.

As the fifth transistor T25 and the sixth transistor T26 can be simultaneously turned on by the third high voltage GVDD3, a voltage difference between the gate voltage of the first transistor T21 and the voltage of the second connection node NC2 can increase by enabling the third high voltage GVDD3 to be constantly supplied to the second connection node NC2. Thus, when the preceding stage carry signal C(k−2) having a low level is input to the gate of the first transistor T21, and thereby, the first transistor T21 is turned off, the first transistor T21 can completely remain in the turned-off state due to a voltage difference between the gate voltage of the first transistor T21 and the voltage of the second connection node NC2. Thus, the current leakage of the first transistor T21 and the voltage drop of the Q node caused by the current leakage of the first transistor T21 can be prevented, this enabling the voltage of the Q node to be stably maintained.

For example, when the threshold voltage of the first transistor T21 is negative polarity (−), the gate-source voltage Vgs of the first transistor T21 can be maintained as negative polarity (−) by the third high voltage GVDD3 supplied to the drain electrode thereof. Thus, the preceding stage carry signal C(k−2) having the low level is input to the gate of the first transistor T21, and thereby, the first transistor T21 is turned off, the first transistor T21 can completely remain in the turned-off state and the occurrence of corresponding leakage current can be prevented.

In one embodiment, the third high voltage GVDD3 may be set to a voltage level lower than the first high voltage GVDD1.

The third transistor T23 and the fourth transistor T24 can be connected between the Q node and the third low voltage line for transmitting the third low voltage GVSS3. The third transistor T23 and the fourth transistor T24 can be connected in series with each other.

The third transistor T23 and the fourth transistor T24 can discharge the Q node and the QH node to the third low voltage GVSS3 in response to the input of the following stage carry signal C(k+2). The fourth transistor T24 can be turned on by the input of the following stage carry signal C(k+2) and discharge the QH node to the third low voltage GVSS3. The third transistor T23 can be turned on by the input of the following stage carry signal C(k+2) and electrically connect the Q node and the QH node. Accordingly, when the third transistor T23 and the fourth transistor T24 are simultaneously turned on, the Q node and the QH node can be discharged or reset to the third low voltage GVSS3.

The seventh transistor T27 and the eighth transistor T28 can be connected between the first high voltage line for transmitting the first high voltage GVDD1 and the Q node and between the first high voltage line for transmitting the first high voltage GVDD1 and the QH node. The seventh transistor T27 and the eighth transistor T28 can be connected in series with each other.

The seventh transistor T27 and the eighth transistor T28 can supply the first high voltage GVDD1 to the QH node in response to the voltage of the Q node. The fourth transistor T27 can be turned on when the voltage of the Q node is at a high level, and supply the first high voltage GVDD1 to a shared node of the seventh transistor T27 and the eighth transistor T28. The eighth transistor T28 can be turned on when the voltage of the Q node is at the high level and electrically connect the shared node and the QH node. Thus, the seventh transistor T27 and the eighth transistor T28 can be simultaneously turned on when the voltage of the Q node is at the high level and supply the first high voltage GVDD1 to the QH node.

When the first high voltage GVDD1 is supplied to the QH node, a voltage difference between the gate of the third transistor T23 and the QH node can increase. Thus, the following stage carry signal C(k+2) having a low level is input to the gate of the third transistor T23, and thereby, the third transistor T23 is turned off, the third transistor T23 can completely remain in the turned-off state due to a voltage difference between the gate voltage of the third transistor T23 and the voltage of the QH node. Thus, the current leakage of the third transistor T23 and the voltage drop of the Q node caused by the current leakage of the third transistor T23 can be prevented, this enabling the voltage of the Q node to be stably maintained.

The Q node and QH node stabilizing circuit 506 can discharge the Q node and the QH node to the third low voltage GVSS3 level in response to the voltage of the QB node.

The Q node and QH node stabilizing circuit 506 may include a first transistor T31 and a second transistor T32. The first transistor T31 and the second transistor T32 can be connected between the Q node and the third low voltage line for transmitting the third low voltage GVSS3. The first transistor T31 and the second transistor T32 can be connected in series with each other.

The first transistor T31 and the second transistor T32 can discharge the Q node and the QH node to the third low voltage GVSS3 in response to the voltage of the QB node. The second transistor T32 can be turned on when the voltage of the QB node is at a high level and supply the third low voltage GVSS3 to a shared node of the first transistor T31 and the second transistor T32. The first transistor T31 can be turned on when the voltage of the QB node is at the high level and electrically connect the Q node and the QH node. Accordingly, when the first transistor T31 and the second transistor T32 are simultaneously turned on by the voltage of the QB node, the Q node and the QH node can be discharged or reset to the third low voltage GVSS3.

The inverter 508 can change a voltage level of the QB node according to a voltage level of the Q node.

The inverter 508 may include first to fifth transistors T41 to T45.

The second transistor T42 and the third transistor T43 can be connected between a second high voltage line for transmitting a second high voltage GVDD2 and a third connection node NC3. The second transistor T42 and the third transistor T43 can be connected in series with each other.

The second transistor T42 and the third transistor T43 can supply the second high voltage GVDD2 to the third connection node NC3 in response to the second high voltage GVDD2. The second transistor T42 can be turned on by the second high voltage GVDD2 and supply the second high voltage GVDD2 to the shared node of the second transistor T42 and the third transistor T43. The third transistor T43 can be turned on by the second high voltage GVDD2 and electrically connect the shared node of the second transistor T42 and the third transistor T43 and the third connection node NC3. Accordingly, when the second transistor T42 and the third transistor T43 are simultaneously turned on by the second high voltage GVDD2, the third connection node NC3 can be charged to the second high voltage (GVDD2) level.

The fourth transistor T44 can be connected between the third connection node NC3 and a second low voltage line for transmitting a second low voltage GVSS2.

The fourth transistor T44 can supply the second low voltage GVSS2 to the third connection node NC3 in response to the voltage of the Q node. The fourth transistor T44 can be turned on when the voltage of the Q node is at the high level and discharge or reset the third connection node NC3 to the second low voltage GVSS2.

The first transistor T41 can be connected between the second high voltage line for transmitting the second high voltage GVDD2 and the QB node.

The first transistor T41 can supply the second high voltage GVDD2 to the QB node in response to the voltage of the third connection node NC3. The first transistor T41 can be turned on when the voltage of the third connection node NC3 is at the high level and charge the QB node to the second high voltage (GVDD2) level.

The fifth transistor T45 can be connected between the QB node and the third low voltage line for transmitting the third low voltage GVSS3.

The fifth transistor T45 can supply the third low voltage GVSS3 to the QB node in response to the voltage of the Q node. The fifth transistor T45 can be turned on when the voltage of the Q node is at the high level and discharge or reset the QB node to the third low voltage GVSS3 level.

The carry signal output circuit 512 can output a carry signal C(k) based on a voltage level of a carry clock signal CRCLK(k) according to the voltage level of the Q node or the third low voltage GVSS3 according to the voltage level of the QB node.

The carry signal output circuit 512 may include a first transistor T61, a second transistor T62, and a boosting capacitor CC.

The first transistor T61 can be connected between a clock signal line for transmitting the carry clock signal CRCLK(k) and a first output node NO1. The boosting capacitor CC can be connected between the gate and the source of the first transistor T61.

The first transistor T61 can output the carry signal C(k) having a high voltage through the first output node NO1 based on the carry clock signal CRCLK(k) in response to the voltage of the Q node. The first transistor T61 can be turned on when the voltage of the Q node is at the high level and supply the carry clock signal CRCLK(k) having a high voltage to the first output node NO1. Accordingly, the carry signal C(k) having the high voltage can be output.

When the carry signal C(k) is output, the boosting capacitor CC can bootstrap the voltage of the Q node until reaching a boosting voltage level greater than the first high voltage GVDD1 in sync with the carry clock signal CRCLK(k) having the high voltage level. When the voltage of the Q node is bootstrapped, the carry clock signal CRCLK(k) having the high voltage level can be output as the carry signal C(k) quickly and without distortion.

The second transistor T62 can be connected between the first output node NO1 and the third low voltage line for transmitting the third low voltage GVSS3.

The second transistor T62 can output the carry signal C(k) having a low voltage through the first output node NO1 based on the third low voltage GVSS3 in response to the voltage of the QB node. The second transistor T62 can be turned on when the voltage of the QB node is at a high level and supply the third low voltage GVSS3 to the first output node NO1. Accordingly, the carry signal C(k) having the low voltage can be output.

Figure 7:
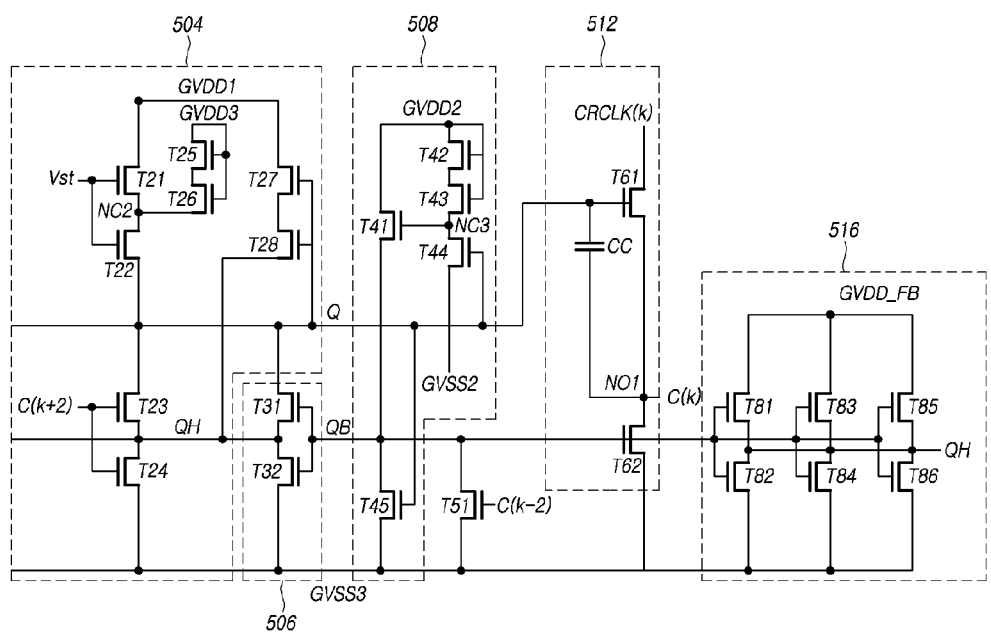
FIG. 7 is a circuit diagram of another dummy stage circuit included in the gate driving circuit according to aspects of the present disclosure.

FIG. 7 is a circuit diagram of another dummy stage circuit included in the gate driving circuit according to aspects of the present disclosure.

The dummy stage circuit shown in FIG. 7 is a circuit diagram of the preceding dummy stage circuit DST2 shown in FIG. 4.

Referring to FIG. 7, in one embodiment, the preceding dummy stage circuit DST2 may include an Q node, a QB node, and a QH node. In one embodiment, the preceding dummy stage circuit DST2 may include a Q node controller 504, a Q node and QH node stabilizing circuit 506, an inverter 508, a carry signal output circuit 512, and an FB TFT circuit 516.

The Q node controller 504, the Q node and QH node stabilizing circuit 506, the inverter 508, and the carry signal output circuit 512 are equal to the Q node controller 504, Q node and QH node stabilizing circuit 506, the inverter 508, and the carry signal output circuit 512 in the circuit diagram of FIG. 6. Considering this, discussions on these elements are omitted and the discussions related to the circuit diagram of FIG. 6 are referred to this embodiment of FIG. 7.

In one embodiment, the FB TFT circuit 516 of the preceding dummy stage circuit DST2 is designed to have the same circuit structure as a T3 TFT (e.g., the first transistor T31 and the second transistor T32) in which the same gate-source voltage Vgs as the T3 TFT is applied. In this case, when PBTS (positive bias temperature stress, a threshold voltage Vth of the T3 TFT is plus-shifted) degradation for the T3 TFT proceeds, a threshold voltage Vth of the FB TFT circuit also is plus-shifted, and a flowing current is reduced. A PGVDD voltage generation block (not shown) can sense such a reduced current of the FB TFT circuit and increase the corresponding PGVDD voltage by the threshold voltage Vth.

The FB TFT circuit 516 may include first to sixth transistors T81 to T86. The first transistor T81 and the second transistor T82 can be connected between a feedback voltage line for transmitting a feedback voltage GVDD_FB and a third low voltage line for transmitting a third low voltage GVSS3. The first transistor T81 and the second transistor T82 can discharge the QH node to the third low voltage GVSS3 in response to the voltage of the QB node. The second transistor T82 can be turned on when the voltage of the QB node is at a high level and supply the third low voltage GVSS3 to a shared node of the first transistor T81 and the second transistor T82. The first transistor T81 can be turned on when the voltage of the QB node is at the high level and supply the feedback voltage GVDD_FB to the QH node. Accordingly, when the first transistor T31 and the second transistor T32 are simultaneously turned on by the voltage of the QB node, the Q node and the QH node can be discharged or reset to the third low voltage GVSS3. The third transistor T83 and the fourth transistor T84, and the fifth transistor T85 and the sixth transistor T86, have the same functions and operations as the first transistor T81 and the second transistor T82, and thus, discussions on these elements may be omitted for convenience of description. In addition, the number of the transistors included in the FB TFT circuit 516 is not limited to that shown in FIG. 7. For example, the FB TFT circuit 516 may include one or more pairs of two transistors which are serially connected between the feedback voltage line and the third low voltage line for transmitting the third low voltage, and gate electrodes of each of the one or more pairs of the two transistors may be commonly connected to the QB node, and a connection node between the first transistors and the second transistors may be commonly connected to the QH node.

Figure 8:
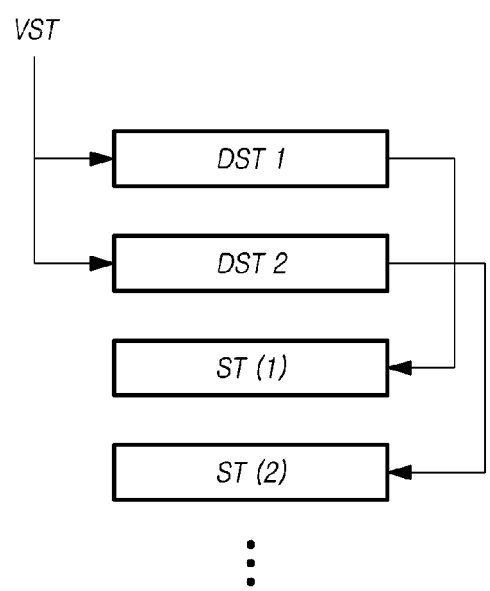
FIG. 8 is a first carry signal line connection diagram of stage circuits included in the gate driving circuit according to aspects of the present disclosure.
Figure 9:
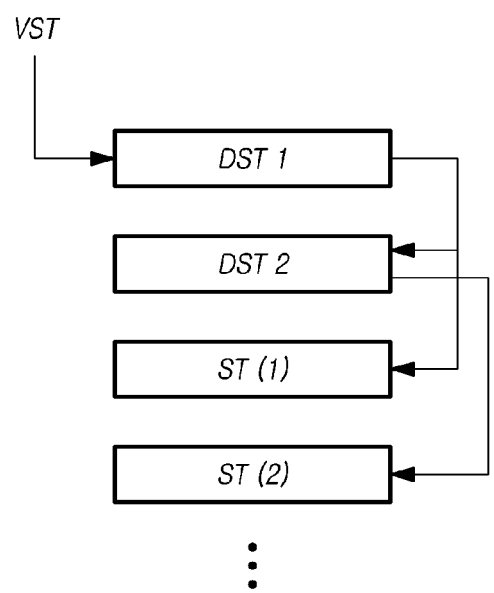
FIG. 9 is a second carry signal line connection diagram of stage circuits included in the gate driving circuit according to aspects of the present disclosure.

FIG. 8 is a first carry signal line connection diagram of the stage circuits described herein, and FIG. 9 is a second carry signal line connection diagram of the stage circuits described herein.

Referring to FIG. 8, in one embodiment, a carry signal line between the stage circuits can be connected such that a carry signal line is connected from a first preceding dummy stage circuit DST1 of the preceding dummy stage circuits (DST1, DST2) to the first stage circuit ST(1), and a carry signal line is connected from a second preceding dummy stage circuit DST2 of the preceding dummy stage circuits (DST1, DST2) to the second stage circuit ST(2). The stage circuits in the first carry signal line connection diagram can be performed such that a start signal Vst is simultaneously input to the first preceding dummy stage circuit DST1 and the second preceding dummy stage circuit DST2 for RT sensing line initialization, and thereby, the first and second preceding dummy stage circuits DST1 and DST2 are activated, generate preceding stage carry signals C, and output the generated preceding stage carry signals C to the first and second stage circuits ST(1) and ST(2), respectively.

However, when variable refresh rate (VRR) driving is performed based on the first carry signal line connection diagram of the stage circuits of FIG. 8, the first and second preceding dummy stage circuits DST1 and DST2 can be activated, and the FB TFT circuit 156 of the second preceding dummy stage circuit DST2 is turned off and corresponding PGVDD voltage increases, this causing a display artifact such as a horizontal line to occur due to a voltage difference caused.

In order to solve the occurrence of such a horizontal line in the VRR driving by the first carry signal line connection diagram of the stage circuits of FIG. 8, the second carry signal line connection diagram of the stage circuits as shown in FIG. 9 has been developed.

The occurrence of a display artifact such as a horizontal line can be solved if the stage circuits are driven by the second carry signal line connection diagram as shown in FIG. 9 in the VRR driving. Related discussions are given with reference to FIGS. 6, 7 and 9 as follows:

i. A start signal Vst is input to the first preceding dummy stage circuit DST1 for RT sensing line initialization; ii. Then, the first preceding dummy stage circuit DST1 can be activated, generate a preceding stage carry signal C, and output the generated preceding stage carry signal C to the second preceding dummy stage circuit DST2 and the first stage circuit ST(1); and iii. Thereafter, the second preceding dummy stage circuit DST2 can be activated when the preceding stage carry signal C from the first preceding dummy stage circuit DST1 is input, generate a preceding stage carry signal C, and output the generated preceding stage carry signal C to the second stage circuit ST(2).

In this manner, in the second carry signal line connection diagram, since the start signal Vst can be input only to the first preceding dummy stage circuit DST1, and the preceding stage carry signal C from the first preceding dummy stage circuit DST1 is input to the second preceding dummy stage circuit DST2, the Q node of the second preceding dummy stage circuit DST2 is not activated, and thus, the QB node can be remained in the on-state and the FB TFT circuit 156 can operate normally.

When the FB TFT circuit 156 of the second preceding dummy stage circuit DST2 operates normally, since there is no change in corresponding PGVDD voltage, therefore, a voltage difference may not be caused, and the occurrence of a horizontal line caused by the first carry signal line connection diagram of the stage circuits can be prevented.

Figure 10:
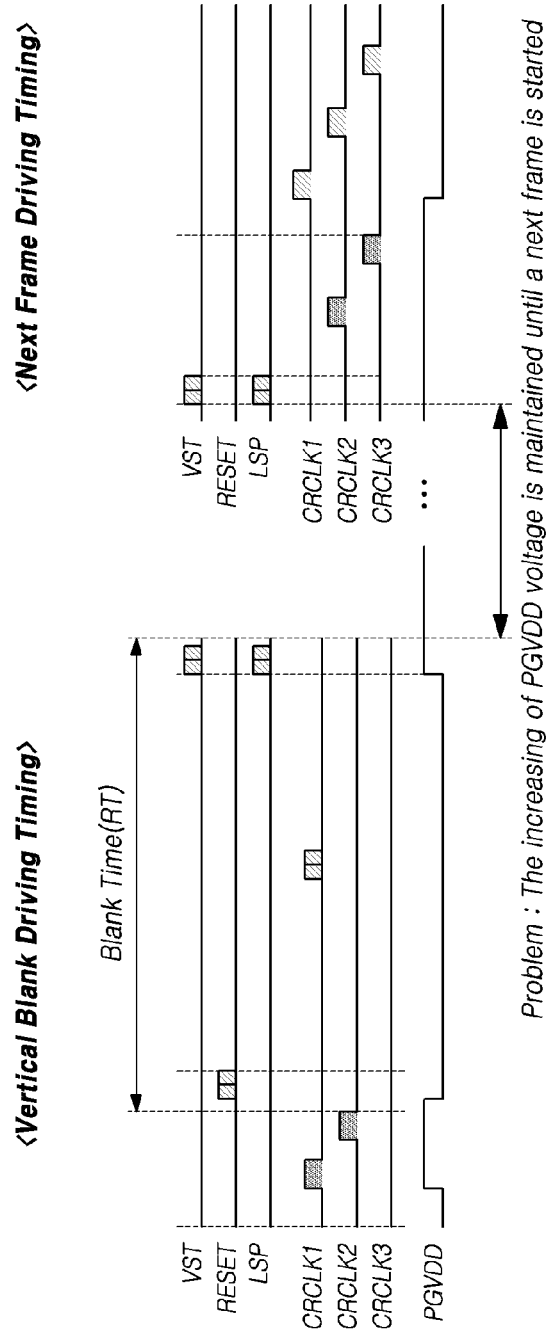
FIG. 10 is a driving timing diagram of the stage circuits in the first connection configuration of FIG. 8.

FIG. 10 is a driving timing diagram of the stage circuits in the VRR driving according to the first connection diagram of FIG. 8. In FIG. 10, it can be seen that the FB TFT circuit 156 of the second preceding dummy stage circuit DST2 is turned off, and the increasing of corresponding PGVDD voltage is maintained until a next frame is started.

Figure 11:
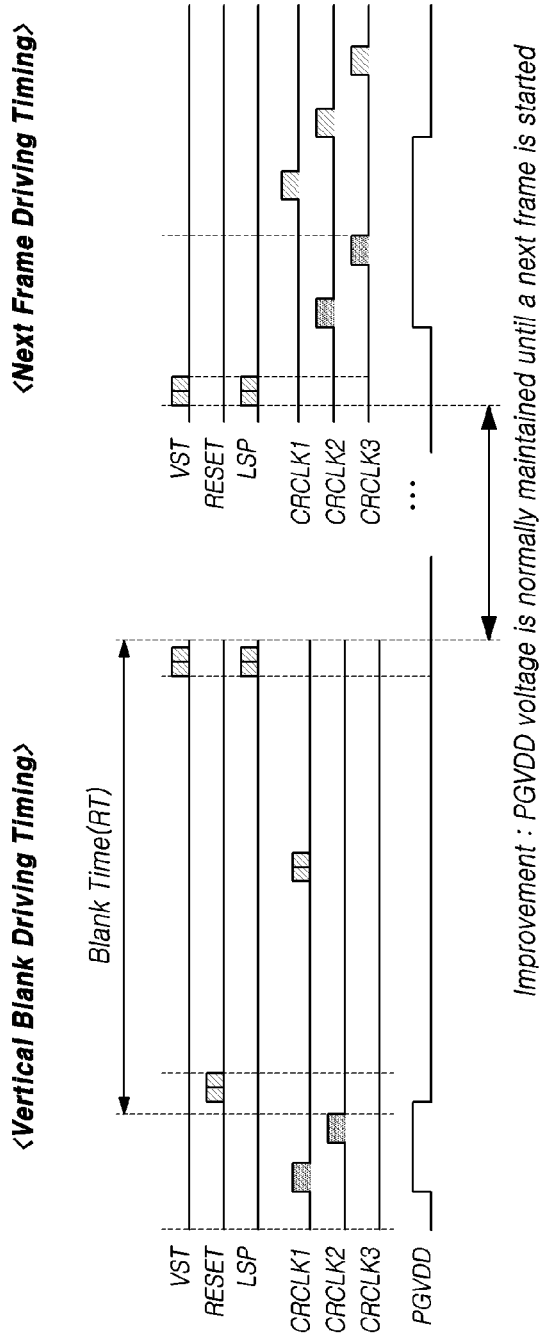
FIG. 11 is a driving timing diagram of the stage circuits in the second connection configuration of FIG. 9.

FIG. 11 is a driving timing diagram of the stage circuits in the VRR driving according to the second connection diagram of FIG. 9. In FIG. 9, it can be seen that the FB TFT circuit 156 of the second preceding dummy stage circuit DST2 is turned on, and corresponding PGVDD voltage is normally maintained until a next frame is started.

As described above, referring to FIGS. 6, 7, 10 and 11, as the stage circuits according to the embodiments of the present disclosure are driven according to the second connection diagram of the carry signal line when the VRR driving is performed, display artifacts such as a horizontal line can be solved and image display quality can be improved.

Figure 12:
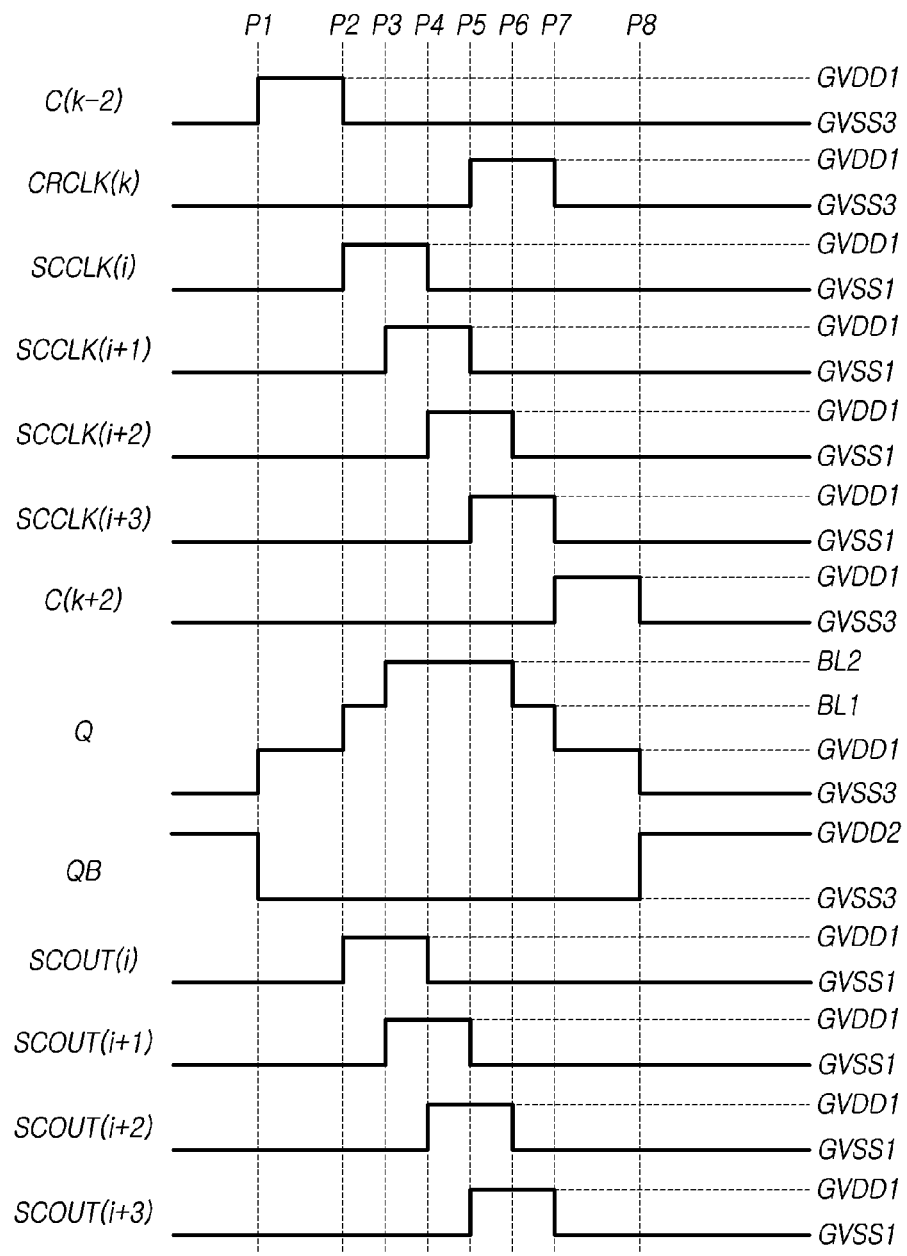
FIG. 12 illustrates waveforms of input signals and output signals when the stage circuit of FIG. 5 outputs gate signals for image display, in the gate driving circuit according to aspects of the present disclosure.

FIG. 12 illustrates waveforms of input signals and output signals when the stage circuit of FIG. 5 outputs gate signals for image display, in the gate driving circuit according to aspects of the present disclosure.

In a period (from P1 to P2), when a preceding stage carry signal C(k−2) having a high level is input, the first transistor T21 and the second transistor T22 of the Q node controller 504 can be turned on. Accordingly, the Q node can be charged to the first high voltage (GVDD1) level. As the first transistor T51 of the QB node stabilizing circuit 510 is turned on by the preceding stage carry signal C(k−2) having the high level, the QB node can be discharged to the third low voltage GVSS3.

In a period (from P2 to P3), when a scan clock signal SCCLK(i) having a high level is input, the voltage of the Q node is bootstrapped to a first boosting voltage (BL1) level higher than the first high voltage GVDD1 by the boosting capacitor CS1. Accordingly, in the period (from P2 to P3), a gate signal SCOUT(i) can be output from the second output node NO2.

In a period (from P3 to P4), when a scan clock signal SCCLK(i+1) having a high level is input together with the scan clock signal SCCLK(i) having the high level, the voltage of the Q node can be bootstrapped to a second boosting voltage (BL2) level higher than the first boosting voltage (BL1) level by the boosting capacitors (CS1, CS2). Accordingly, in the period (from P3 to P4), a gate signal SCOUT(i+1) can be output from the third output node NO3.

In a period (from P4 to P5), when a scan clock signal SCCLK(i+2) having a high level is input together with the scan clock signal SCCLK(i+1) having the high level, the voltage of the Q node can be remained at the second boosting voltage (BL2) level higher than the first boosting voltage (BL1) level by the boosting capacitors (CS2, CS3). Accordingly, in the period (from P4 to P5), a gate signal SCOUT(i+2) can be output from the fourth output node NO4.

In a period (from P5 to P6), when a scan clock signal SCCLK(i+3) having a high level is input together with the scan clock signal SCCLK(i+2) having the high level, the voltage of the Q node can be remained at the second boosting voltage (BL2) level higher than the first boosting voltage (BL1) level by the boosting capacitors (CS3, CS4). Accordingly, in the period (from P5 to P6), a gate signal SCOUT(i+3) can be output from the fifth output node NO5.

In a period (from P6 to P7), since only the scan clock signal SCCLK(i+3) having the high level is input, the voltage of the Q node can drop to the level of the first boosting voltage BL1 by the boosting capacitor CS4.

Further, in the period (from P6 to P7), when a carry clock signal CRCLK(k) having a high level is input, a carry signal C(k) from the first output node NO1 can be output by the first transistor T61 turned on by the voltage charged in the Q node.

In a period (from P7 to P8), since a scan clock signal is not input, the voltage of the Q node can be charged to the first high voltage (GVDD1) level again. Further, in the period (from P7 to P8), when a following stage carry signal C(k+2) having a high level is input, the third transistor T23 and the fourth transistor T24 of the Q node controller 504 can be turned on. Accordingly, at the time point of P8, the Q node can be discharged to the third low voltage GVSS3. When the Q node is discharged to the third low voltage GVSS3, as the fourth transistor T44 included in the inverter 508 is turned off, and the second high voltage GVDD2 is applied to the gate of the first transistor T41, the first transistor T41 can be turned on. When the first transistor T41 is turned on, the QB node can be charged to the second high voltage (GVDD2) level.

The stage circuits of the gate driving circuit 13 shown in FIGS. 4 and 5 do not share the QB node. Therefore, the QB node can be turned on or off every frame. Accordingly, the transistors (T31, T32, T62, T72, T74, T76, T78) connected to the QB node can be turned on or off every frame.

In this manner, if the transistors (T31, T32, T62, T72, T74, T76, T78) connected to the QB node are turned on or off every frame, the transistors (T31, T32, T62, T72, T74, T76, T78) may be degraded rapidly due to voltage stress applied to the transistors T31, T32, T62, T72, T74, T76, and T78). Degradation of the transistor due to voltage stress applied to the transistor may cause threshold voltages of the transistors to rise, and in turn, cause the degraded performance and the shortened lifespan of the display device 1.

Accordingly, in order to reduce the degradation rate of the transistors (T31, T32, T62, T72, T74, T76, T78) connected to the QB node, the gate driving circuit 13 according to aspects of the present disclosure can be capable of adjusting a voltage charged to the QB node, a magnitude of the second high voltage GVDD2.

FIG. 13 is a graph representing a change in the magnitude of the second high voltage according to a driving time of the gate driving circuit in the display device according to aspects of the present disclosure. In FIG. 13, the horizontal axis represents a driving time of the gate driving circuit 13, and the vertical axis represents a magnitude of the second high voltage GVDD2 shown in FIG. 13.

In one embodiment, the magnitude of the second high voltage GVDD2 supplied to the QB node shown in FIG. 13 can be adjusted according to a driving time of the gate driving circuit 13.

For example, as shown in FIG. 13, as the driving time of the gate driving circuit 13 increases, the magnitude of the second high voltage GVDD2 can increase. That is, as shown in FIG. 13, whenever the driving time of the gate driving circuit 13 increases to AT1, AT2, AT3, AT4, or AT5, the magnitude of the second high voltage GVDD2 can increase stepwise to GV1, GV2, GV3, GV4, and GV5. At this time, the magnitudes (GV1, GV2, GV3, GV4, GV5) of the second high voltage GVDD2 for each stage may be values greater than or equal to the threshold voltages of the transistors (T31, T32, T62, T72, T74, T76, T78) connected to the QB node at each driving time (AT1, AT2, AT3, AT4, AT5), and be determined experimentally.

FIG. 13 shows an embodiment in which the magnitude of the second high voltage GVDD2 increases stepwise as the driving time of the gate driving circuit 13 increases. However, in another embodiment, the magnitude of the second high voltage GVDD2 may increase linearly or non-linearly in proportion to the driving time of the gate driving circuit 13.

Further, AT1, AT2, AT3, AT4, AT5, GV1, GV2, GV3, GV4, and GV5 shown in FIG. 13 are values that can be set differently according to embodiments, and can be determined experimentally.

In addition, intervals between AT1, AT2, AT3, AT4, and AT5 and intervals between GV1, GV2, GV3, GV4, and GV5 shown in FIG. 13 may be set to be the same or different. For example, a difference value between AT2 and AT1 may be set to be the same as or different from a difference value between AT5 and AT4. As another example, a difference value between GV3 and GV2 may be set to be the same as or different from a difference value between GV5 and GV4.

As shown in FIG. 13, by increasing the magnitude of the second high voltage GVDD2 in proportion to the driving time of the gate driving circuit 13, the gate driving circuit 13 can be normally driven and voltage stress applied to the transistors (T31, T32, T62, T72, T74, T76, and T78) connected to the QB node can be minimized. Accordingly, the lifespan of the display device 1 can be extended.

FIG. 14 is a graph representing a change in the threshold voltage magnitude of a transistor according to a driving time of the gate driving circuit in the display device according to aspects of the present disclosure.

In FIG. 14, data 1204 represents a change in the threshold voltage magnitude of the transistors connected to the QB node when the second high voltage GVDD2 with the same magnitude at all times is supplied to the QB node in the gate driving circuit 13 shown in FIGS. 4 and 5.

Further, data 1206 represents a change in the threshold voltage magnitude of the transistors connected to the QB node when the magnitude of the second high voltage GVDD2 increases according to a driving time of the gate driving circuit 13 in the gate driving circuit 13 shown in FIGS. 4 and 5.

The data 1204 of FIG. 14 shows that, when the second high voltage GVDD2 with the same magnitude at all times is supplied to the QB node in the gate driving circuit 13 shown in FIGS. 4 and 5, the threshold voltage magnitude of the transistors connected to the QB node sharply increases. Accordingly, the transistors connected to the QB node can be rapidly degraded, and the lifespan of the display device 1 can be shortened.

However, as can be seen from the data 1206 of FIG. 14, when the magnitude of the second high voltage GVDD2 according to a driving time of the gate driving circuit 13 in the gate driving circuit 13 shown in FIGS. 4 and 5 is adjusted, an increasing rate of the threshold voltage magnitude of the transistors connected to the QB node is significantly lower compared with the situation where the magnitude of the second high voltage GVDD2 is with the same magnitude at all times. Accordingly, the lifespan of the display device 1 can be more extended.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the embodiments have been described for illustrative purposes, a person skilled in the art will appreciate that various modifications and applications are possible without departing from the essential characteristics of the present disclosure. For example, the specific components of the embodiments may be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown. The scope of protection of the present disclosure is to be construed according to the claims, and all technical ideas within the scope of the claims should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driving circuit, comprising:
   first and second dummy stage circuits that are each capable of supplying a carry signal and each comprise a Q node, a QH node, and a QB node; and
   a plurality of stage circuits that are each capable of supplying gate signals to each gate line and each include the Q node, the QH node, and the QB node,
   wherein each of the stage circuits includes:
      a line selector for charging an M node based on a preceding stage carry signal in response to the input of a line sensing preparation signal, and charging the Q node to a first high voltage level in response to the input of a reset signal or discharging the Q node to a third low voltage level in response to the input of a panel-on signal;

a Q node controller for charging the Q node to the first high voltage level in response to the input of the preceding stage carry signal, and discharging the Q node to the third low voltage level in response to the input of a following stage carry signal;

a Q node and QH node stabilizing circuit for discharging the Q node and the QH node to the third low voltage level when the QB node is charged to a second high voltage level;

an inverter for changing the voltage level of the QB node according to the voltage level of the Q node;

a QB node stabilizing circuit for discharging the QB node to the third low voltage level in response to the input of the following stage carry signal, the input of the reset signal, and a charged voltage of the M node;

a carry signal output circuit for outputting a carry signal based on a voltage level of a carry clock signal according to the voltage level of the Q node or the third low voltage level according to the voltage level of the QB node; and a gate signal output circuit for outputting first to j-th gate signals based on first to j-th scan clock signals or a first low voltage according to the voltage level of the Q node or the voltage level of the QB node; and wherein a dummy stage circuit of the first and second dummy stage circuits includes an feedback (FB) circuit, the FB circuit including one or more pairs of transistors, each pair of transistors including a first transistor and a second transistor serially connected between a feedback voltage line for transmitting a feedback voltage and a low voltage line of the dummy stage circuit, gate electrodes of the first transistor and the second transistor commonly connected to the QB node of the dummy stage circuit, and a connection node between the first transistor and the second transistor commonly connected to the QH node of the dummy stage circuit.

2. The gate driving circuit according to claim 1, wherein each of the first and second dummy stage circuits comprises:

a Q node controller for charging the Q node to the first high voltage level in response to the input of a start signal, and discharging the Q node to the third low voltage level in response to the input of a following stage carry signal;

a Q node and QH node stabilizing circuit for discharging the Q node and the QH node to the third low voltage level when the QB node is charged to the second high voltage level;

an inverter for changing a voltage level of the QB node according to a voltage level of the Q node;

a carry signal output circuit for outputting a carry signal based on a voltage level of the carry clock signal according to the voltage level of the Q node or the third low voltage level according to the voltage level of the QB node.

3. The gate driving circuit according to claim 2, wherein the second dummy stage circuit includes the FB circuit to prevent TFT degradation.

4. The gate driving circuit according to claim 3, wherein a preceding stage carry signal line of the first dummy stage circuit is applied to the second dummy stage circuit and a first stage circuit of the plurality of stage circuits, and a preceding stage carry signal line of the second dummy stage circuit is connected to a second stage circuit of the plurality of stage circuits.

5. The gate driving circuit according to claim 1, wherein the first high voltage level and the second high voltage level are different from each other.

6. The gate driving circuit according to claim 1, wherein the line selector includes a first transistor and a second transistor connected between the M node and a preceding stage carry signal line for supplying the preceding stage carry signal, and a third transistor connected between a connection node between the first transistor and the second transistor and a first high voltage line for supplying the first high voltage level; and the first transistor and the second transistor are controlled by the line sensing preparation signal, and the third transistor is controlled by a voltage of the M node.

7. The gate driving circuit according to claim 1, wherein when the voltage level of the Q node is at a high voltage level, the gate signal output circuit sequentially outputs the first to j-th gate signals based on the first to j-th scan clock signals.

8. The gate driving circuit according to claim 1, wherein the gate signal output circuit comprises:

a pull-up transistor that is turned on when the voltage level of the Q node is at a high voltage level, and is capable of supplying the first to j-th scan clock signals to an output node;

a pull-down transistor that is turned on when the voltage level of the QB node is a high voltage level, and is capable of supplying the first low voltage to the output node; and a boosting capacitor connected between a gate and a source of the pull-up transistor.

9. The gate driving circuit according to claim 8, wherein the pull-down transistor is turned on when the voltage level of the QB node is charged to the second high voltage level.

10. The gate driving circuit according to claim 1, wherein the Q node and QH node stabilizing circuit comprises a first transistor and a second transistor turned on when the QB node is charged to the second high voltage level.

11. The gate driving circuit according to claim 1, wherein a magnitude of the second high voltage level is adjusted according to a driving time of the gate driving circuit.

12. The gate driving circuit according to claim 1, wherein a magnitude of the second high voltage level increases as a driving time of the gate driving circuit increases.

13. A display device, comprising:

a display panel comprising sub-pixels, each positioned adjacent to an overlap of a gate line of gate lines and a data line of data lines;

a gate driving circuit for supplying scan signals to each of the gate lines;

a data driving circuit for supplying data voltages to each of the data lines; and a timing controller for controlling the driving of the gate driving circuit and the data driving circuit, wherein the gate driving circuit includes:

first and second dummy stage circuits that are each capable of supplying a carry signal and each comprise a Q node, a QH node, and a QB node; and a plurality of stage circuits that are each capable of supplying gate signals to each gate line and each include the Q node, the QH node, and the QB node, wherein each of the stage circuits further includes:

a line selector for charging an M node based on a preceding stage carry signal in response to the input of a line sensing preparation signal, and charging the Q node to a first high voltage level in response to the input of a reset signal or discharging the Q node to a third low voltage level in response to the input of a panel-on signal;
- a Q node controller for charging the Q node to the first high voltage level in response to the input of the preceding stage carry signal, and discharging the Q node to the third low voltage level in response to the input of a following stage carry signal;
- a Q node and QH node stabilizing circuit for discharging the Q node and the QH node to the third low voltage level when the QB node is charged to a second high voltage level;
- an inverter for changing the voltage level of the QB node according to the voltage level of the Q node;
- a QB node stabilizing circuit for discharging the QB node to the third low voltage level in response to the input of the following stage carry signal, the input of the reset signal, and a charged voltage of the M node;
- a carry signal output circuit for outputting a carry signal based on a voltage level of a carry clock signal according to the voltage level of the Q node or the third low voltage level according to the voltage level of the QB node; and
- a gate signal output circuit for outputting first to j-th gate signals based on first to j-th scan clock signals or a first low voltage according to the voltage level of the Q node or the voltage level of the QB node, wherein a dummy stage circuit of the first and second dummy stage circuits includes an feedback (FB) circuit, the FB circuit including one or more pairs of transistors, each pair of transistors including a first transistor and a second transistor serially connected between a feedback voltage line for transmitting a feedback voltage and a low voltage line of the dummy stage circuit, gate electrodes of the first transistor and the second transistor commonly connected to the QB node of the dummy stage circuit, and a connection node between the first transistor and the second transistor commonly connected to the QH node of the dummy stage circuit.

14. A gate driving circuit comprising:
first and second dummy stage circuits that are each capable of supplying a carry signal and each comprise a Q node, a QH node, and a QB node; and
a plurality of stage circuits that are each capable of supplying gate signals to each gate line and each include the Q node, the QH node, and the QB node,
wherein the second dummy stage circuit comprises an FB TFT circuit to prevent TFT degradation,
wherein a preceding stage carry signal line of the first dummy stage circuit is applied to the second dummy stage circuit and a first stage circuit of the plurality of stage circuits, and a preceding stage carry signal line of the second dummy stage circuit is connected to a second stage circuit of the plurality of stage circuits, and wherein the FB TFT circuit includes one or more pairs of first transistors and second transistors which are serially connected between a feedback voltage line for transmitting a feedback voltage and a third low voltage line for transmitting a third low voltage, and gate electrodes of each of the one or more pairs of first transistors and second transistors are commonly connected to the QB node of the second dummy stage circuit, and a connection node between the first transistors and the second transistors are commonly connected to the QH node of the second dummy stage circuit.

15. A display device, comprising:
a display panel comprising sub-pixels, each positioned adjacent to an overlap of a gate line of gate lines and a data line of data lines;
a gate driving circuit for supplying scan signals to each of the gate lines;
a data driving circuit for supplying data voltages to each of the data lines; and
a timing controller for controlling the driving of the gate driving circuit and the data driving circuit,
wherein the gate driving circuit includes:
first and second dummy stage circuits that are each capable of supplying a carry signal and each comprise a Q node, a QH node, and a QB node; and
a plurality of stage circuits that are each capable of supplying gate signals to each gate line and each include the Q node, the QH node, and the QB node,
wherein the second dummy stage circuit comprises an FB TFT circuit to prevent TFT degradation,
wherein a preceding stage carry signal line of the first dummy stage circuit is applied to the second dummy stage circuit and a first stage circuit of the plurality of stage circuits, and a preceding stage carry signal line of the second dummy stage circuit is connected to a second stage circuit of the plurality of stage circuits, and
wherein the FB TFT circuit includes one or more pairs of transistors, each pair of transistors including a first transistor and a second transistor serially connected between a feedback voltage line for transmitting a feedback voltage and a low voltage line of the second dummy stage circuit, gate electrodes of the first transistor and the second transistor commonly connected to the QB node of the second dummy stage circuit, and a connection mode between the first transistor and the second transistor commonly connected to the QH node of the second dummy stage circuit.

* * * * *

UNITED STATES PATENT AND TRADEMARK OFFICE
CERTIFICATE OF CORRECTION

PATENT NO. : 12,073,794 B2  
APPLICATION NO. : 18/054872  
DATED : August 27, 2024  
INVENTOR(S) : Jaeyi Choi et al.

Page 1 of 1

It is certified that error appears in the above-identified patent and that said Letters Patent is hereby corrected as shown below:

In the Claims

Column 32, Claim 15, Line 51:
"connection mode between"
Should read:
--connection node between--

Signed and Sealed this
Twelfth Day of November, 2024

Katherine Kelly Vidal
*Director of the United States Patent and Trademark Office*